United States Patent [19]

Asai et al.

[11] Patent Number: 5,692,292
[45] Date of Patent: Dec. 2, 1997

[54] TRANSFER TYPE CIRCUIT BOARD FABRICATING SYSTEM

[75] Inventors: Koichi Asai, Nagoya; Kunio Oe, Chiryu; Masayuki Shimmura, Anjo, all of Japan

[73] Assignee: Fuji Machine Mfg. Co., Ltd., Aichi-ken, Japan

[21] Appl. No.: 520,989

[22] Filed: Aug. 30, 1995

[30] Foreign Application Priority Data

Sep. 2, 1994 [JP] Japan .................................. 6-209885

[51] Int. Cl.$^6$ ............................. H05K 3/30; H05K 13/02; H05K 13/08; B23P 21/00

[52] U.S. Cl. .................. 29/740; 29/703; 29/742; 29/743; 29/786; 29/793; 198/341; 198/571; 364/468.19; 364/468.28; 414/273

[58] Field of Search ........................... 29/703, 714, 739, 29/740, 742, 743, 783, 786, 793, 794; 198/341, 571; 414/273, 274; 364/468.19, 468.2, 468.29

[56] References Cited

U.S. PATENT DOCUMENTS

| | | | |
|---|---|---|---|
| 4,631,812 | 12/1986 | Young | 29/740 X |
| 4,719,694 | 1/1988 | Herberich et al. | 414/273 X |
| 5,329,690 | 7/1994 | Tsuji et al. | 29/742 X |
| 5,513,427 | 5/1996 | Yokoyama et al. | 29/793 X |

FOREIGN PATENT DOCUMENTS

| | | | |
|---|---|---|---|
| 599319 | 6/1994 | European Pat. Off. | 29/739 |
| 269600 | 11/1988 | Japan | 29/742 |
| B2-3-3960 | 1/1991 | Japan | 29/739 |

*Primary Examiner*—Peter Vo
*Attorney, Agent, or Firm*—Oliff & Berridge

[57] ABSTRACT

A transfer type circuit board fabricating system having a plurality of working modules each including (a) a conveyor device for transferring circuit boards in a predetermined transfer direction, (b) a working device for performing a predetermined operation on the circuit boards, and (c) a controller constituted principally by a computer, for controlling the working device, wherein the conveyor devices transfer the circuit boards one after another in the predetermined transfer direction through the working devices of the working modules, the system further having a coordinating control device constituted principally by a computer, for controlling the controllers of the working modules, on the basis of predetermined working schedule information stored therein, and status information which is received from the controllers of said working modules and which indicates operating states of the working modules.

24 Claims, 20 Drawing Sheets

TRANSFER TYPE CIRCUIT BOARD FABRICATING SYSTEM

BACKGROUND OF THE INVENTION

1. Field of the Invention

The present invention relates in general to a transfer type fabricating system capable of placing electronic components on circuit boards such as printed circuit boards, and performing other working operations on the circuit boards. More particularly, the invention is concerned with such a transfer type circuit board fabricating system wherein predetermined working operations are successively performed on the circuit boards by respective working devices at different working stations while the circuit board are transferred by a conveyor device or devices through the working stations.

2. Discussion of the Prior Art

For producing a circuit board such as a printed circuit board, a substrate for the circuit board is generally subjected to various operations such as: application of a creamy solder by screen printing to local portions of the substrate at which electronic components are placed; application of an adhesive material to those portions of the substrate; and placement of electronic components on the substrate. To this end, there is known a transfer type circuit board fabricating system or assembly wherein two ore more working devices are arranged along a conveyor device adapted to transfer printed circuit boards or substrates thereof, as disclosed in JP-B-3-3960 (published in 1991). Since this transfer type circuit board fabricating system is adapted to perform same or different working operations concurrently on the different working devices, the system is capable of fabricating the circuit boards with relatively high efficiency. Where the fabricating system has only one working device adapted to perform all working operations required for a given circuit board, a new or another working device is needed for the fabrication of a different circuit board, which requires an additional or different working operation or operations. That is, the new working device should be capable of effecting such additional or different working operations. In the transfer type fabricating system having two or more working devices, the additional or different working operations can be dealt with by adding a working device or devices and/or replacing some of the existing working devices by a new working device or devices. Thus, the transfer type fabricating system permits the fabrication of two or more different kinds of circuit boards by effectively utilizing the existing working devices.

On other hand, the transfer type circuit board fabricating system has various drawbacks, which arise from mutual independence of the working devices arranged along the conveyor device and mutual independence of controllers exclusively used for the respective working devices.

One example of the drawbacks of the transfer type fabricating system lies in that the system suffers from difficulty in changing its setup where the circuit board to be fabricated is changed. In the case of the working device arranged to place electronic components or chips on a substrate for the circuit board, the working device includes a placer head for placing the components on the substrate, a three-dimensional positioning device for positioning the placer head along three axes, and a controller for controlling the placer head and positioning device. When the electronic circuit on the circuit board to be fabricated is changed from one kind to another, the components to be placed on the substrate and the placement positions of the components on the substrate are changed. In this case, it is required to accordingly change or modify control programs stored in a read-only memory of a computer which constitutes a major part of the controller. Thus, it is cumbersome and time-consuming for the user of the fabricating system to change or modify the control programs for each of the working devices each time the circuit board to be fabricated is changed.

Often, the transfer type circuit board fabricating system includes two or more working devices or modules which have respective devices or units which are functionally identical with each other. Since the working devices of the conventional fabricating system are independent of each other, each of those working devices should incorporate the same functional device or unit. Consequently, the conventional system suffers from a relatively high cost of manufacture.

SUMMARY OF THE INVENTION

It is therefore an object of the present invention to eliminate or minimize the drawbacks of the conventional transfer type circuit board fabricating system, which arise from the mutual independence of the individual working devices.

The above object may be achieved according to the present invention, which provides a transfer type circuit board fabricating system comprising: a plurality of working modules each of which includes (a) a conveyor device for transferring circuit boards in a predetermined transfer direction, (b) a working device for performing a predetermined operation on the circuit boards, and (c) a controller comprising a computer as a major portion thereof, for controlling the working device, the working modules being arranged such that the conveyor devices transfer the circuit boards one after another in the predetermined transfer direction through the working devices of the working modules; and a coordinating control device comprising a computer as a major portion thereof, for controlling the controllers of the plurality of working modules, on the basis of predetermined working schedule information stored therein, and status information which is received from the controllers of the working modules and which indicates operating states of the working modules.

In the transfer type circuit board fabricating system of the present invention constructed as described above, the predetermined operations are performed concurrently on the circuit boards by the working devices in the two or more working modules. The operations performed by the individual working devices are the same or different from each other.

The predetermined working schedule information is supplied from the coordinating control device to the controllers of the individual working modules, and the working devices are controlled by the controllers on the basis of the working schedule information. Where the operation to be performed by a given working device is an operation to place electronic components on the circuit boards, the working schedule information includes, for example: data indicative of the kinds of the electronic components; data indicative of the number of the electronic components to be placed on each circuit board; data indicative of the positions on the circuit boards at which the electronic components are placed; data indicating whether the electronic components are provisionally fixed on the circuit boards; and data indicative of the number of the circuit boards on which the component placing operation is performed.

The controller of each working module provides the coordinating control device with the status information, which includes, for instance: information indicating that the operation on the appropriate circuit board has been completed; information indicating that the operations on the predetermined number of circuit boards have been completed; information indicating that the electronic components to be placed on the circuit boards have been exhausted; and information indicating that a fixing material for provisionally fixing the electronic components on the circuit boards has been exhausted. On the basis of the status information received from the individual controllers, the coordinating control device is able to provide each controller with adequate working schedule information that meets the particular operating state of the corresponding working module, and if necessary, the particular operating state or states of the other working module or modules. If the working operation in one working module is delayed, the working operation or operations in the other working module or modules is/are interrupted. Thus, the coordinating control device controls the working operations in the individual working modules through the respective controllers, depending upon the actual working states of the working devices.

When the setup of the fabricating system is changed due to a change in the type of the circuit boards, for example, the coordinating control device provides the controllers with a new set of working schedule information for the new type of circuit boards on which the operations are to be performed. Consequently, the working programs in the controllers of the individual working modules are automatically updated, for controlling the working devices to perform the working operations on the new circuit boards.

As described above, the controllers provided in the individual working modules control the respective working devices, on the one hand, while the controllers are controlled or governed by the coordinating control device. For instance, the working programs used by the controllers are automatically updated under the control of the coordinating control device, upon changing of the circuit boards from one type to another, as indicated above. Consequently, the user or operator of the fabricating system is not required to provide the individual controllers with information necessary for performing the working operations on the new type of circuit boards. Instead, the user or operator simply manipulates the coordinating control device upon setup changing of the fabricating system. Accordingly, the setup of the system can be easily effected.

In a first preferred form of this invention, the working device of each working module comprises a component placing device for placing electronic components on the circuit boards. The component placing device has a predetermined component placement area in which the electronic components can be placed on the circuit boards and whose dimension in the predetermined transfer direction is smaller than a dimension of the each working module. The conveyor device intermittently transfers the circuit boards by a predetermined distance at one time, which distance is not larger than the dimension of the component placement area in the transfer direction.

In the fabricating system according to the present first preferred form of the invention, the entire area of the appropriate circuit board can be located within the predetermined placement area of the component placing device by one operation of the conveyor device to transfer the circuit board, if the dimension of the circuit board in the predetermined transfer direction of the circuit board is smaller than that of the component placement area and if the distance of transfer of the circuit board by one operation of the conveyor device is not larger than the dimension of the component placement area in the transfer direction. If the dimension of the circuit board in the transfer direction is larger than that of the component placement area, a leading portion of the circuit board is first located within the component placement area by a first operation of the conveyor device to transfer the circuit board, and the remaining trailing portion of the circuit board is then located within the component placement area by at least one subsequent operation of the conveyor device to transfer the circuit board. If the distance of transfer of the circuit board by one operation of the conveyor device is smaller than the dimension of the component placement area in the transfer direction, two or more intermittent operations of the conveyor device are required to locate the entire area of the circuit board within the component placement area, even where the dimension of the circuit board in the transfer direction is smaller than that of the component placement area.

Where the circuit board is transferred intermittently by two or more operations of the conveyor device, the transfer distance of the circuit board may be constant in all the operations, or the transfer distances in the two or more operations may differ from each other.

The transfer distance of the circuit board in each operation of the conveyor device may be equal to or smaller than the dimension of the component placement area in the transfer direction. In the former case, the portion of the circuit board in which the electronic component have not been placed yet is located within the component placement area, and the electronic components may be easily placed in that portion of the circuit board, by positioning the component placing device with respect to the downstream end of the component placement area, which is used as a reference or zero point in the horizontal plane.

In a second preferred form of this invention, the circuit board fabricating system further comprises a loading module located upstream of a succession of the plurality of working modules as viewed in the predetermined transfer direction. The loading module includes a conveyor device for introducing the circuit boards into one of the working modules located at an upstream end of the succession of the working modules. In this case, the coordinating control device is provided in the loading module.

In the fabricating system constructed according to the above second preferred form of the invention, the circuit boards on which the working operations are to be performed are automatically introduced by the loading module into the succession of the working modules. For instance, the loading module is provided downstream of another transfer type circuit board fabricating device, to introduce the partially fabricated circuit boards (on which some electronic components have already been placed) into the present fabricating device. The loading module may be provided downstream of a circuit board storage or supply device which stores circuit boards (substrates) without any electronic components placed thereon. The fabricating system may include one or more auxiliary modules additional to the working modules. The auxiliary modules are provided to perform operations other than the operations performed by the working modules. The loading module is a typical example of the auxiliary modules.

Usually, a portion of the fabricating system in which the loading module is provided has an empty space above or below the conveyor device of the loading module. The coordinating control device described above is conveniently accommodated is this empty space.

Thus, the present second preferred form of the invention does not require a space exclusively used for installation of the coordinating control device, whereby the fabricating system can be made compact and relatively small-sized, and the freedom in designing the system is improved.

In a third preferred form of the invention, the fabricating system further comprises an unloading module located downstream of a succession of the plurality of working modules as viewed in the predetermined transfer direction. The unloading module includes a conveyor device for removing the circuit boards from one of the working modules located at a downstream end of the succession of the working modules. The coordinating control device is provided in the unloading module.

In the fabricating system constructed according to the above third preferred form of the invention, the circuit boards on which the intended operations in all the working modules have been completed are automatically removed by the unloading device from the system, that is, delivered from the last working module located at the downstream end of the system. The unloading module is also one of the auxiliary modules. An empty space is also provided above or below the conveyor device of the unloading module, and the coordinating control device is provided in this empty space.

The fabricating system according to the above third preferred form of the invention provides substantially the same advantages as the system according to the above second preferred form of the invention.

In a fourth preferred form of this invention, the coordinating control device includes a common data processor for processing data received from the controllers of the working modules, in place of the controllers. Where the two or more working modules are assigned to perform the same working operations, data processing operations necessary to perform the working operations are the same, and are therefore effected by the single common data processor provided in the coordinating control device, on the basis of appropriate data received from the individual controllers. Therefore, the controllers do not require their own data processors for effecting data processing operations necessary to perform the same or common working operations in the two or more working modules. Accordingly, the controllers can be simplified and are available at a reduced cost.

According to one advantageous arrangement of the above fourth preferred form of the invention, the working device of each working module comprises a reference mark imaging device for obtaining image data of a reference mark provided on each of the circuit boards, and the common data processor includes an image data processing portion for processing the image data.

According to another advantageous arrangement of the same fourth preferred form of the invention, the working device of each working module comprises a component placing device for placing electronic components on the circuit boards, and a component imaging device for obtaining image data representative of an attitude of each of the electronic components when each electronic component is held by the component placing device. In this case, the common data processor includes an image data processing portion for processing the image data.

Image data obtained by an imaging device provided in each working module may be processed by a computer in the same manner according to a common image data processing program. In view of this, the common data processor provided in the coordinating control device is designed to include an image data processing portion to process the image data obtained by the reference mark imaging device or the component imaging device. In this arrangement, the controllers of the individual working modules do not require their own image data processors, and are accordingly simplified and are available at a reduced cost.

In a fifth preferred form of the present invention, at least one of the working devices of the plurality of working modules includes a component placing device for placing the electronic components on the circuit boards, a component supply device for supplying the component placing device with the electronic components, and a coating device for coating the electronic components with a fixing material for provisionally fixing the electronic components on the circuit boards before the electronic components supplied from the component supply device are placed on the circuit boards. The coating device includes a material holder for holding the fixing material in the form of a layer.

In the fabricating system according to the fifth preferred form of the invention, the electronic components to be placed on the circuit boards by the component placing device are coated with a suitable fixing material for provisionally fixing the electronic components on the circuit boards. Where the electronic components are fixed by a solder on the circuit boards, the solder is melted by heat application in a suitable heating furnace, so that the electronic components are permanently fixed or bonded to the circuit boards by the solder. In this respect, it is noted that the electronic components placed on the circuit boards may be dislocated from the nominal positions, while the circuit boards are transferred with the electronic components into the heating furnace. To prevent this dislocation of the electronic components, it is desirable to provisionally fix the electronic components on the circuit boards. To this end, the electronic components are coated with the fixing material, by contacting the electronic components with the material held by the material holder, before the electronic components are placed on the circuit boards. Thus, the electronic components are provisionally fixed on the circuit boards.

The fixing material may be a flux or a liquid agent, as described below with respect to the preferred embodiments of the invention.

In one advantageous arrangement of the above fifth preferred form of the invention, the coating device includes a squeezer, and a moving device for moving the squeezer and the material holder relative to each other, the material holder having a sliding surface on which the squeezer slidably moves, and a recess which has a predetermined depth from the sliding surface and which accommodates the layer of the fixing material. The moving device is adapted to move the squeezer in sliding contact with the sliding surface to thereby fill the recess with the layer of the fixing material. The coating device may be adapted to bring each electronic component into contact with a bottom surface of the recess through the layer of the fixing material, to thereby coat each electronic component with the fixing material.

If the fixing material has a relatively high viscosity and may take the form of a layer when placed on a flat surface, it is not necessary to hold the material in a recess as described above. In this case, the material holder may be simplified.

The material holder may include a base, and a hollow member which is removably fixed on the base and which cooperates with the base to define the recess. In this case, the depth of the recess may be changed as needed, by changing the height or thickness dimension of the hollow member as measured from the base. Thus, the amount of the fixing material to be applied to the electronic component can be changed, depending upon the kind of the electronic component.

In a second advantageous arrangement of the above fifth preferred form of the invention, the coating device includes means for moving each of the electronic components held by the component placing device, into contact with the layer of the fixing material, to thereby coat the each electronic component with the fixing material, and means for controlling a distance of movement of each electronic component relative to the layer of the fixing material in contact with the layer.

In the above arrangement, the same material holder can be used for the electronic components which have different sizes and require accordingly different amounts of the fixing material to be applied thereto. Described more specifically, the material holder is designed to be able to accommodate a layer of the fixing material whose thickness is large enough to coat the largest electronic component which requires the largest amount of the fixing material. The amount of the fixing material to be applied to the electronic components can be optimized by suitably changing the distance of movement of the electronic components relative to the layer of the fixing material, depending upon the particular size or required amount of the fixing material of the specific electronic components.

The coating device may be disposed adjacent to the component supply device in the predetermined transfer direction of the circuit boards. In the present arrangement, the electronic component received from the component supply device may reach the coating device by simply moving the electronic component by a relatively short distance in the transfer direction of the circuit boards. This arrangement permits easy and efficient coating of the electronic components with the fixing material.

In a sixth preferred form of this invention, at least one of the working devices of the plurality of working modules includes a component placing device for placing the electronic components on the circuit boards, a component supply device for suppling the component placing device with the electronic components, and an applying device for applying by capillarity a fixing material between the electronic components and the circuit boards, for provisionally fixing the electronic components on the circuit boards.

In the fabricating system according to the above sixth preferred form of the invention, the fixing material is applied between the electronic components and the surface of the circuit boards after the electronic components are placed on the circuit boards, whereby the electronic components are provisionally fixed on the circuit boards.

The applying device may include a material container for accommodating the fixing material, a delivery tube communicating with the material container, and a device for forcing the fixing material in the material container to thereby deliver the fixing material through the delivery tube.

In a seventh preferred form of the invention, at least one of the working devices of the plurality of working modules includes a component supply device, and a component placing device for receiving the electronic components from the component supply device and placing the electronic components on the circuit boards, the component supply device including (i) a plurality of component supply pallets each accommodating a plurality of electronic components, (ii) a pallet storage having a plurality of pallet racks which are spaced from each other in a vertical direction and which support the plurality of component supply pallets, respectively, (iii) a pallet support block disposed adjacent to the pallet storage, (iv) a first moving device for moving at least one of the pallet storage and the pallet support block relative to each other in the vertical direction so that the pallet support block has the same position in the vertical direction as a selected one of the pallet racks, and (v) a second moving device for moving one of the component supply pallets which corresponds to the selected one of the pallet racks, in a horizontal direction between the selected one of the pallet racks and the pallet support block, the component placing device receiving the electronic components from the component supply pallet placed on the pallet support block.

In the fabricating system according to the above seventh preferred form of the invention, the electronic components are accommodated in the component supply pallets in the pallet storage. The pallet support block and the pallet storage are moved by the first moving device relative to each other so that the pallet rack supporting the component supply pallet which accommodates the electronic components to be placed on the appropriate circuit board has the same height as the pallet support block. Then, the pallet supply pallet in question is moved by the second moving device onto the pallet support block. The component placing device receives the electronic components one after another from the component supply pallet placed on the pallet support block, and places the received electronic components on the circuit board.

The component supply device which uses the component supply pallets as described above is suitable to supply the electronic components which have comparatively large sizes or specially-shaped electronic components such as connectors and sockets.

In one advantageous arrangement of the above seventh preferred form of the invention, the first moving device of the component supply device moves the pallet support block together with the selected component supply pallet in the vertical direction to a component transfer position at which the component placing device receives the electronic components from the selected component supply pallet placed on the pallet support block. In this arrangement, the pallet support block is movable by the first moving device between the component transfer position and a lower position not higher than a lowermost one of the pallet racks of the pallet storage.

The component placing device usually has a placer head which holds the electronic component and which is positioned to place the electronic component at the desired position on the circuit. The placer head is generally moved within a space above the component transfer position. Further, a positioning device for positioning the placer head is usually disposed in the above-indicated space. In the present arrangement wherein the pallet support block is moved in a space below the component transfer position, the pallet support block will not interfere with the placer head during operations of the placer head and the first and second moving devices. In addition, the present arrangement permits the positioning device for the placer head to be disposed within the above-indicated space above the component transfer position.

In another advantageous arrangement of the above seventh preferred form of the invention, the pallet storage and the pallet support blocks are disposed adjacent to each other in the predetermined transfer direction of the circuit boards.

This arrangement permits compact construction of the component supply device owing to side by side installation of the pallet storage and the pallet support block.

In an eighth preferred form of this invention, the fabricating system further comprises at least one common device which is disposed together with the coordinating control device and which is used commonly for all of the plurality of working modules. The common devices may include an electric power source, and a vacuum pump for operating a placer head of the component placing device to hold the electronic component by vacuum suction, for example.

Where the same working operations are performed by the working modules, there are some common devices which are used commonly for the different working modules. Even where different working operations are performed by the different working modules, some common devices are provided. For instance, the electric power source is commonly used for all the working modules. These common devices commonly used for the working devices are provided together with the coordinating control device, so that the working modules are simplified and are available at a reduced cost, whereby the overall cost of manufacture of the fabricating system is accordingly reduced.

In a ninth preferred form of this invention, the conveyor device of each of the plurality of working modules includes a plurality of conveyors which are disposed in series in the predetermined transfer direction of the circuit boards. In this case, the loading and unloading of the electronic components onto and out of the present fabricating system may take place at different times. That is, an unloading operation to remove the circuit board on which the electronic components have been placed and a loading operation to introduce the circuit board on which the working operations are to be performed may take place at different times, so that the fabricating system provides increased operating flexibility and efficiency.

In a tenth preferred form of the present invention, the conveyor device of each of the plurality of working modules is capable of transferring the circuit boards in opposite directions in the predetermined transfer direction. The conveyor devices having this bidirectional function are advantageous where the fabricating system includes two fabricating assemblies each of which has the working modules according to the principle of the present invention described above and which are arranged along straight lines in parallel with each other such that the array or succession of the working modules in one of the two assemblies is opposed to that of the working modules in the other assembly. That is, the bidirectional conveyor devices used in the two fabricating assemblies permit the circuit boards to be transferred in the same direction. Usually, the working modules in each of the two fabricating assemblies are accessible for control by the operator, on one side of the array or succession of the working modules of each fabricating assembly. Where the two fabricating assemblies were arranged such that the accessible sides of the two assemblies are not opposed to each other, that is, face in the same direction perpendicular to the above-indicated straight lines, the circuit boards would be transferred in the same direction by the conveyor devices in the two fabricating assemblies if the conveyor devices are operated in the same direction. This arrangement requires the operator to walk along two operator's control areas in front of the two fabricating assemblies, respectively, for attending (controlling and maintaining) the two fabricating assemblies, whereby the required walking distance of the operator is comparatively long.

If the two fabricating assemblies are arranged such that the accessible sides of the two assemblies are opposed to each other or face each other so as to provide a single operator's control area therebetween, the required walking distance of the operator is considerably reduced, and the two fabricating assemblies can be comparatively easily attended by the operator. However, the order of the working modules in one of the two assemblies is reversed to that in the other assembly (namely, the corresponding working modules in the two assemblies are not opposed to each other), and the transfer directions of the circuit boards in the two assemblies are opposed to each other, if the conveyor devices in the two fabricating assemblies are operated in the same direction. This arrangement makes it difficult for the operator to attend the two assemblies. The corresponding working modules in the two assemblies are opposed to each other by rotating each working module in one of the assemblies through 180° about its vertical axis, and by arranging the two assemblies such that the accessible sides of the two assemblies face each other. To transfer the circuit boards in the same direction in the thus arranged two fabricating assemblies, each conveyor device in one of the two assemblies is operated in the direction opposite to that in the other assembly. In this respect, the use of the bidirectional conveyor devices in the fabricating system as described above is desirable.

The coordinating control device may comprise conveyor control means for directly controlling the conveyor devices of all of the plurality of working modules.

BRIEF DESCRIPTION OF THE DRAWINGS

The above and other objects, features, advantages and technical significance of the present invention will be better understood by reading the following detailed description of presently preferred embodiments of the invention, when considered in connection with the accompanying drawings, in which.

DETAILED DESCRIPTION OF THE PREFERRED EMBODIMENTS

Figure 1:
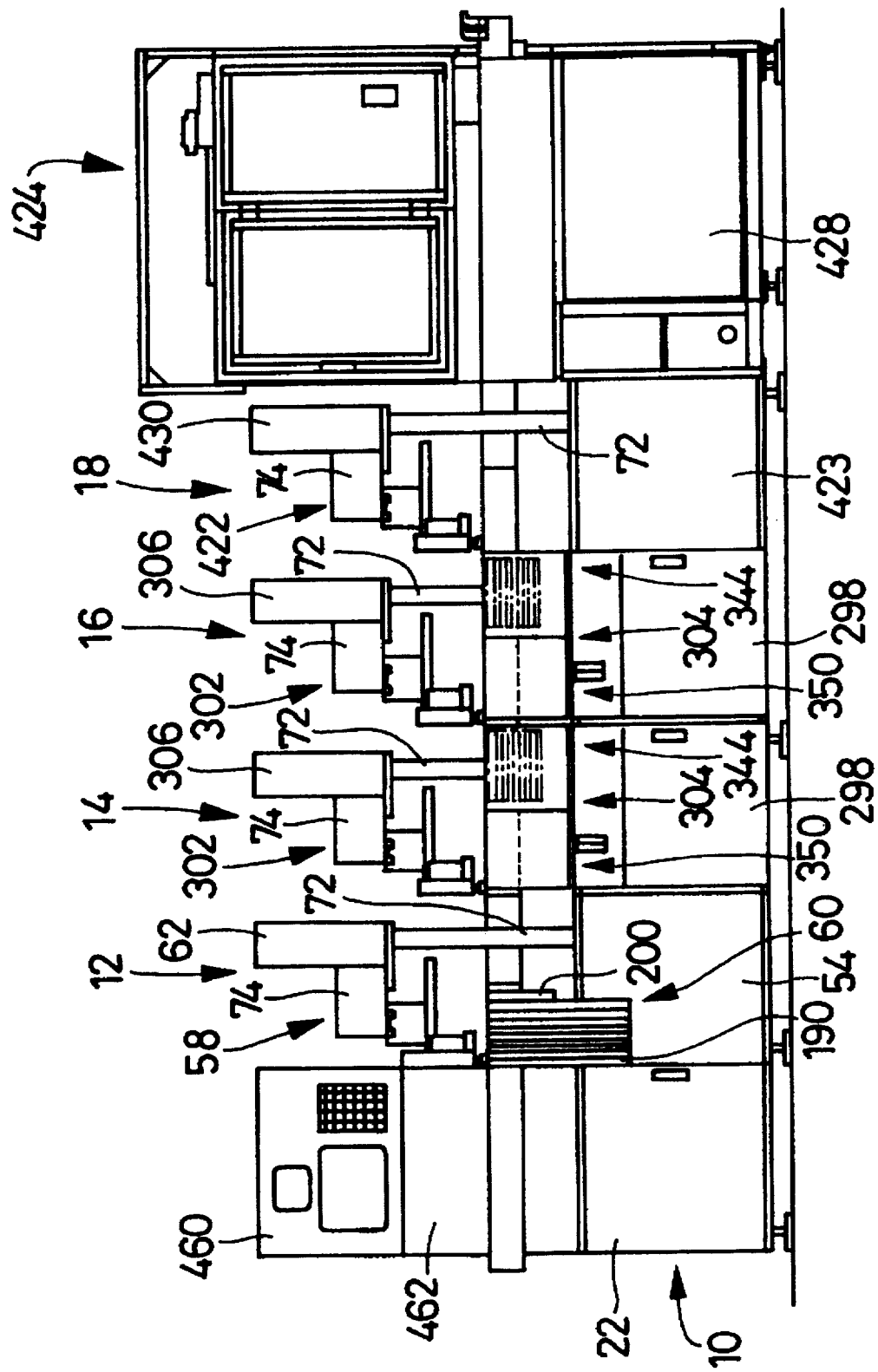
FIG. 1 is a front elevational view of one embodiment of a transfer type electronic circuit board fabricating system consisting of a single assembly.
Figure 2:
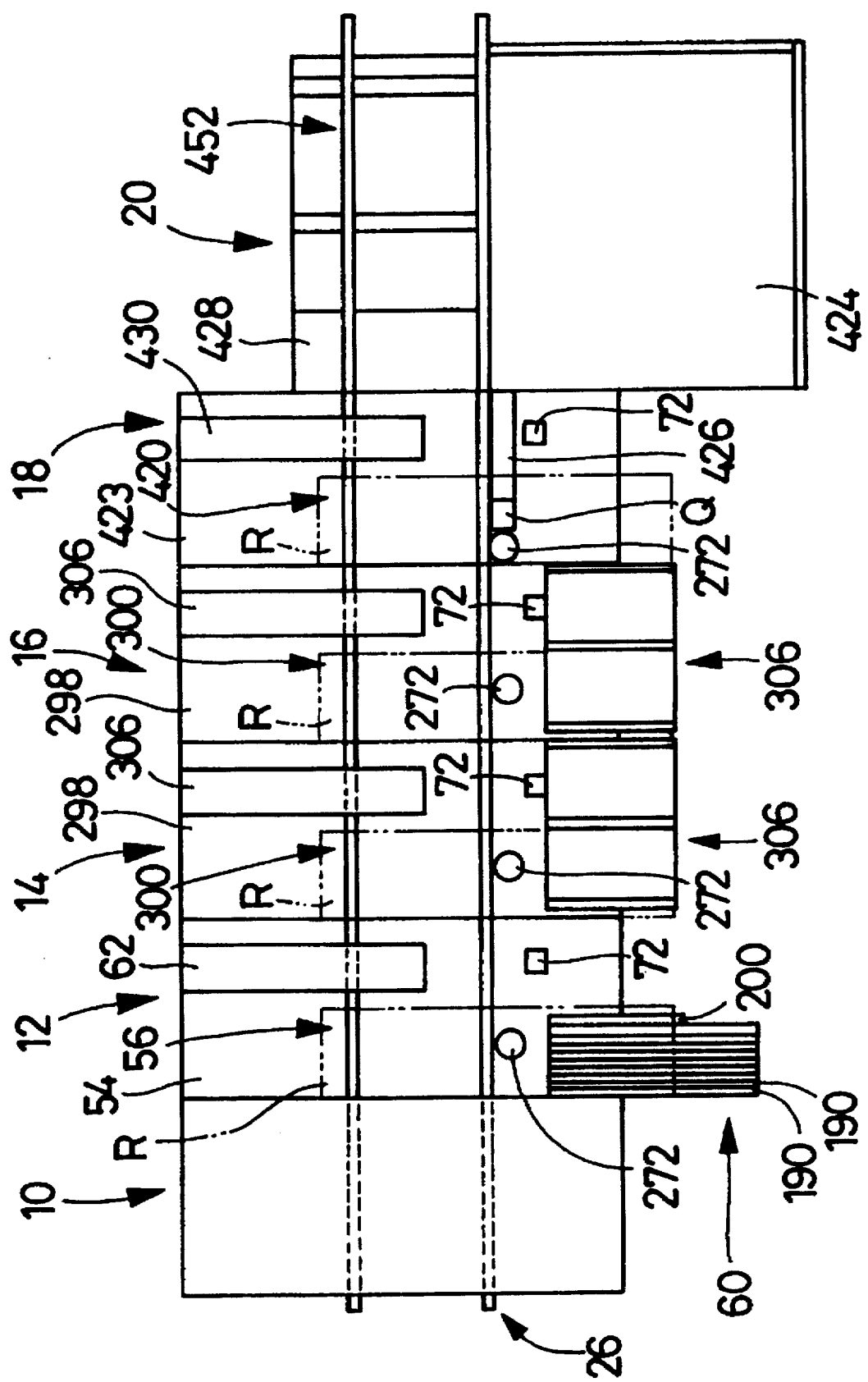
FIG. 2 is a plan view of the assembly of FIG. 1.

Referring first to FIGS. 1 and 2, there is shown a transfer type circuit board fabricating system constructed according to one embodiment of this invention, which consists of a single assembly including a total of six modules 10, 12, 14, 16, 18 and 20 arranged in series in the order of description along a straight line. The six modules consist of a loading module 10, four working modules 12, 14, 16 and an unloading module 20.

The present transfer type circuit board fabricating assembly is located downstream of another fabricating assembly constructed as disclosed in JP-A-7-45995, a publication of unexamined Japanese Patent Application No. 5-191443 filed in the name of the assignee of the present application. The loading module 10 receives a printed circuit board from this upstream fabricating assembly. This upstream fabricating assembly has a plurality of component placing units disposed along a conveyor line which is adapted to feed or transfer the circuit boards (substrates thereof). The component placing units are arranged to place predetermined electronic components or chips on a predetermined portion of each circuit board (or substrate), which lies within a predetermined placement area whose dimension in the circuit board transfer direction is smaller than the size of the circuit board in the same direction (circuit board transfer direction). While the circuit boards are located in position on the individual component placer units, the different electronic components are concurrently placed on the circuit boards, in order to improve the component placement efficiency.

The transfer type circuit board fabricating assembly of FIGS. 1 and 2 according to the present invention is designed to place on the circuit boards electronic components or chips of the kinds which are different from those of the components which have been placed on the circuit boards by the upstream fabricating assembly described above. For example, the present fabricating assembly of FIGS. 1 and 2 are adapted to place electronic components of special kinds or sizes which cannot be supplied by component supply devices of the component placer units of the upstream assembly. Even where those special components can be handled by the upstream assembly, the components are handled by the present assembly if the number of the components that can be accommodated in the component supply devices of the upstream assembly is not large enough to assure sufficiently high operating efficiency of the upstream assembly. In this case, the special components are handled by the present assembly in order to improve the overall fabricating efficiency of the production line which includes the upstream and present fabricating assemblies.

A heating furnace as well known in the art is disposed downstream of the unloading module 20 of the present circuit board fabricating assembly.

Figure 4:
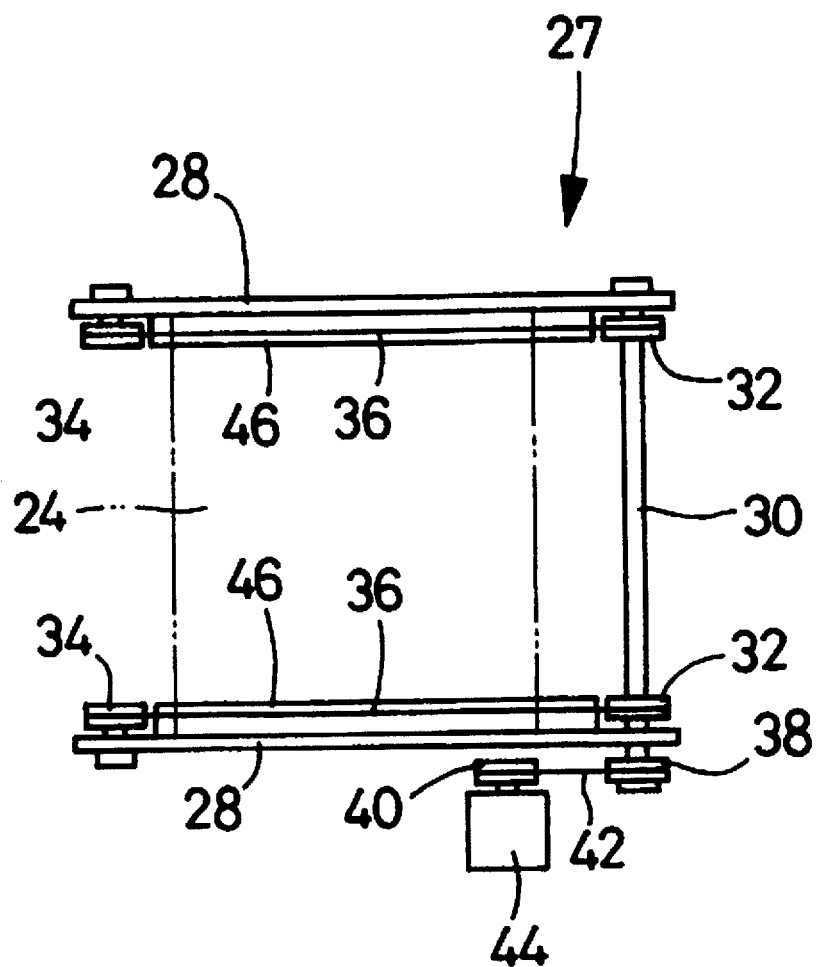
FIG. 4 is a plan view schematically showing a conveyor device of a loading module of the fabricating system of FIG. 1.

The loading module 10 is mounted on a bed 22, and includes a conveyor device 26 which is adapted to receive a printed circuit board (PC board) 24 from the downstream fabricating assembly described above, and load the PC board 24 onto the first working module 12. As schematically shown in FIG. 4, the conveyor device 26 includes a belt conveyor 27, which has a pair of parallel side frames 28 disposed in parallel with an X-axis direction (horizontal direction as seen in FIG. 4) in which the PC board 24 is transferred or conveyed. A drive shaft 30 is rotatably supported by the side frames 28, at one end of each side frame 28 in the X-axis direction. The drive shaft 30 has an axis of rotation which is parallel to a Y-axis direction perpendicular to the X-axis direction. The X axis and Y axis define a horizontal plane (plane of the view in FIG. 4). The drive shaft 30 has two drive pulleys 32 fixed to its opposite end portions.

To the other end of each side frame 28, there is rotatably attached a driven pulley 34, which has an axis of rotation parallel to the Y-axis. The drive and driven pulleys 32, 34 on each side frame 28 are connected by an endless belt 36. The drive shaft 30 is operatively connected to a conveyor drive motor 44 through sprocket wheels 38, 40 and a chain 42 connecting the sprocket wheels 38, 40. With the drive shaft 30 rotated by the motor 44, the endless belts 36 are rotated by the drive pulleys 32, whereby the PC board 24 is transferred by the endless belts 36. The two side frames 28 have respective guide plates 46 attached to their inner surfaces. These guide plates 46 function to support or guide the endless belts 36 at their lower spans. The inner surfaces of the side frames 28 function to guide the PC board 24 while the PC board 24 is transferred by the endless belts 36.

In the vicinity of the downstream end of the belt conveyor 27, there are disposed a stopper device 48 and a board detecting device 50 (FIG. 15) for stopping and detecting the PC board 24, respectively. The stopper device 48 and the board detecting device 50 cooperate with the belt conveyor 27 to constitute the conveyor device 26 of the loading module 10. The stopper device 48 has a stop member which is moved up and down by a suitable device, between an upper position for stopping the PC board 24 and a lower position in which the stop member allows the PC board 24 to be transferred by the belt conveyor 27. The board detecting device 50 has a reflection type photoelectric sensor, and is adapted to detect the PC board 24 stopped by the stopper device 48, depending upon whether a light reflected by the PC board 24 is received by the photoelectric sensor or not.

There will next be described the first working module 12.

Figure 5:
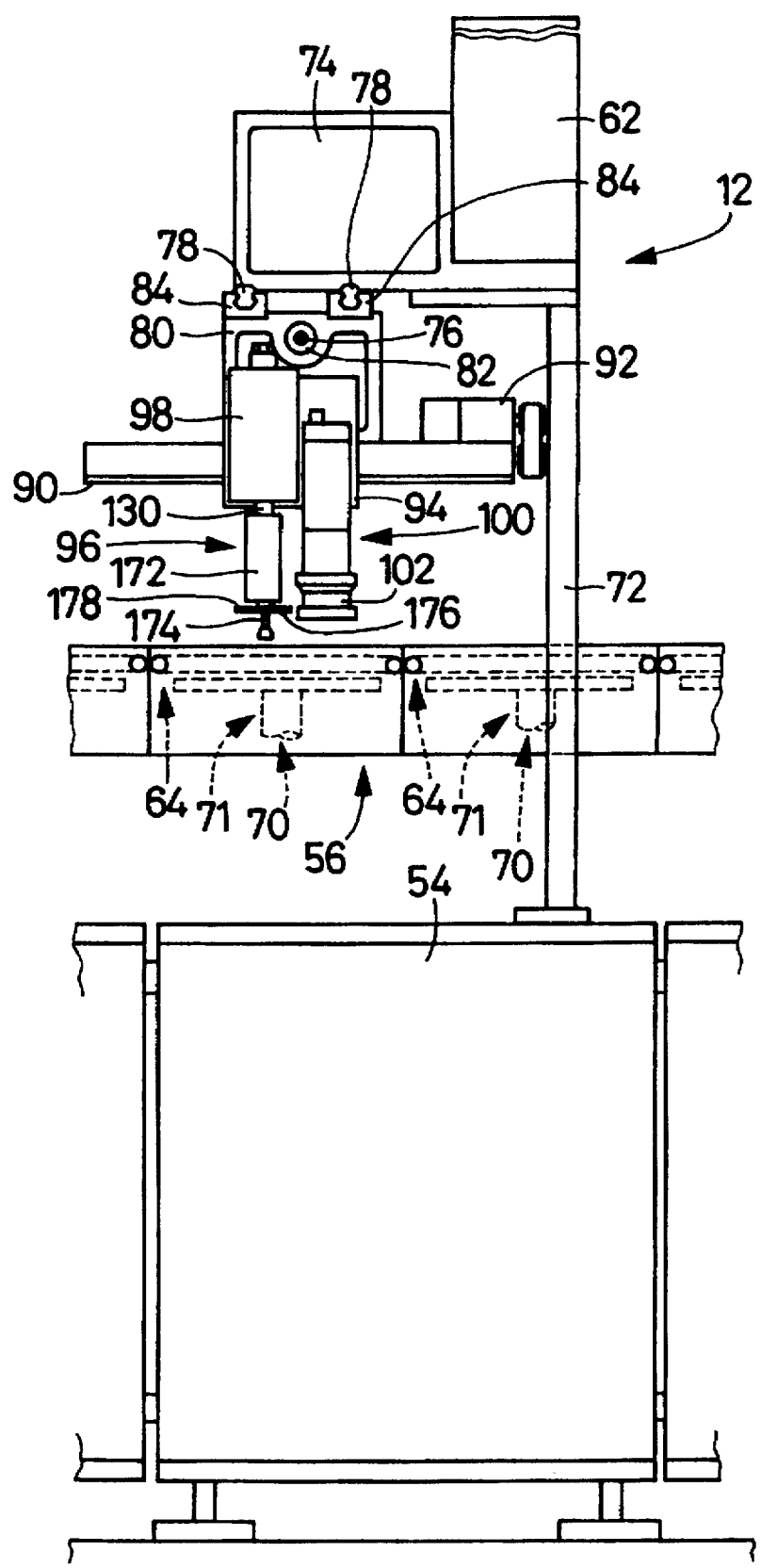
FIG. 5 is a front elevational view of a component placing device of a first working module of the fabricating system of FIG. 1.

The first working module 12 has a conveyor device 56, a component placing device 58, a component supply device 60 and a controller 62, which are all provided on a bed 54. The conveyor device 56 includes two belt conveyors 64 as indicated in FIG. 5. Each of these belt conveyors 64 has the same construction as the belt conveyor 27 of the loading module 10. Each belt conveyor 64 includes two endless belts which are rotated by a conveyor drive motor 66 (FIG. 15) to transfer the PC board 24. A stopper device 68 (FIG. 15) is provided to stop the PC board 24 at the downstream end of the belt conveyors 64 in the board transferring direction (X-axis direction). The distance of transfer of the PC board 24 by each belt conveyor 64 is equal to a half of the X-axis dimension of the first working module 12. The stopper device 68 has the same construction as the stopper device 48 for the conveyor device 26 of the loading module 12. The PC board 24 stopped by the stopper device 68 is detected by a board detecting device 69 similar to the board detecting device 50. The conveyor device 56 has two sets of the belt conveyor 64, stopper device 68 and board detecting device.

Below each belt conveyor 64, there is provided a board support device 70 whose dimension in the X-axis direction is slightly smaller than the dimension of the first working module 12 in the X-axis direction. The board support device 70 includes a lifter 71 (FIG. 5) which is moved up and down by a suitable device. The lifter 71 is adapted to hold the PC board 24 at its top surface by vacuum suction.

Figure 3:
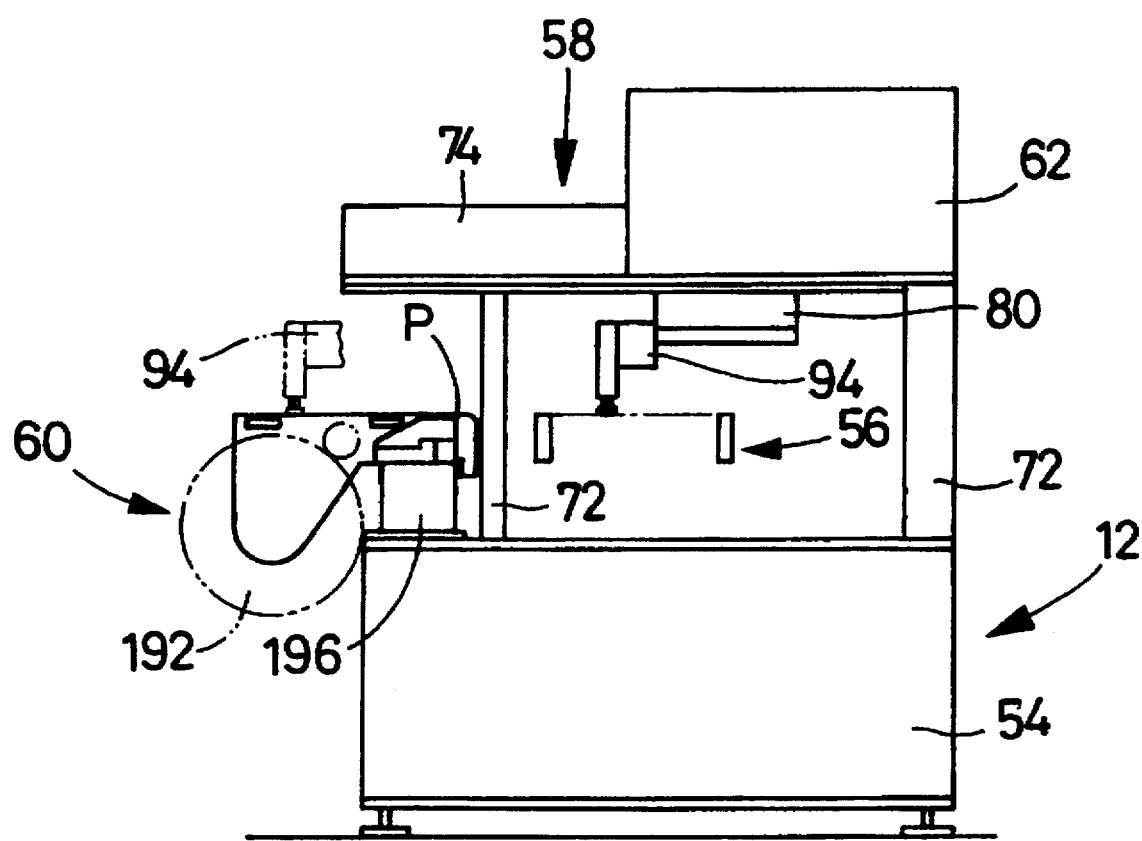
FIG. 3 is a side elevational view of the fabricating system of FIG. 1.

As shown in FIGS. 3 and 5, two posts 72 extend from the upper surface of the bed 54 such that the two posts 72 are spaced from each other in the Y-axis direction. The posts 72 support a beam 74 at their upper ends such that the beam 74 extends in the Y-axis direction. On the underside of the beam 74, there are provided a ballscrew 76 and a pair of guide rails 78 which extend in the Y-axis direction. The ballscrew 76 engages a nut 82 fixed to a Y-axis slide 80. The Y-axis slide 80 has a pair of guide blocks 84 which slidably engage the guide rails 78. With the ballscrew 76 rotated by a Y-axis drive motor 86 (FIG. 9), the Y-axis slide 80 is moved in the Y-axis direction through the nut 82.

The Y-axis slide 80 carries a ballscrew (not shown) and a pair of guide rails 90 (one of which is shown in FIG. 5) which extend in the X-axis direction. The ballscrew engages a nut (not shown) fixed to an X-axis slide 94. With the ballscrew rotated by an X-axis drive motor 92, the X-axis slide 94 is slidably moved on the guide rails 90 in the X-axis direction.

The X-axis slide 94 carries a component placer head 96, a Z-axis and θ-axis drive motor 98 and a reference mark imaging device 100. The drive motor 98 is provided to move the component placer head 96 in a Z-axis direction (vertical direction) and rotate the placer head 96 about the Z-axis (vertical axis). The reference mark imaging device 100 has a CCD (charge coupled device) camera 102, and is movable by the Y-axis and X-axis slides 80, 94, to a desired position in the horizontal plane (defined by the X- and Y-axes), for obtaining an image of a reference mark provided on the PC board 24.

Figure 6:
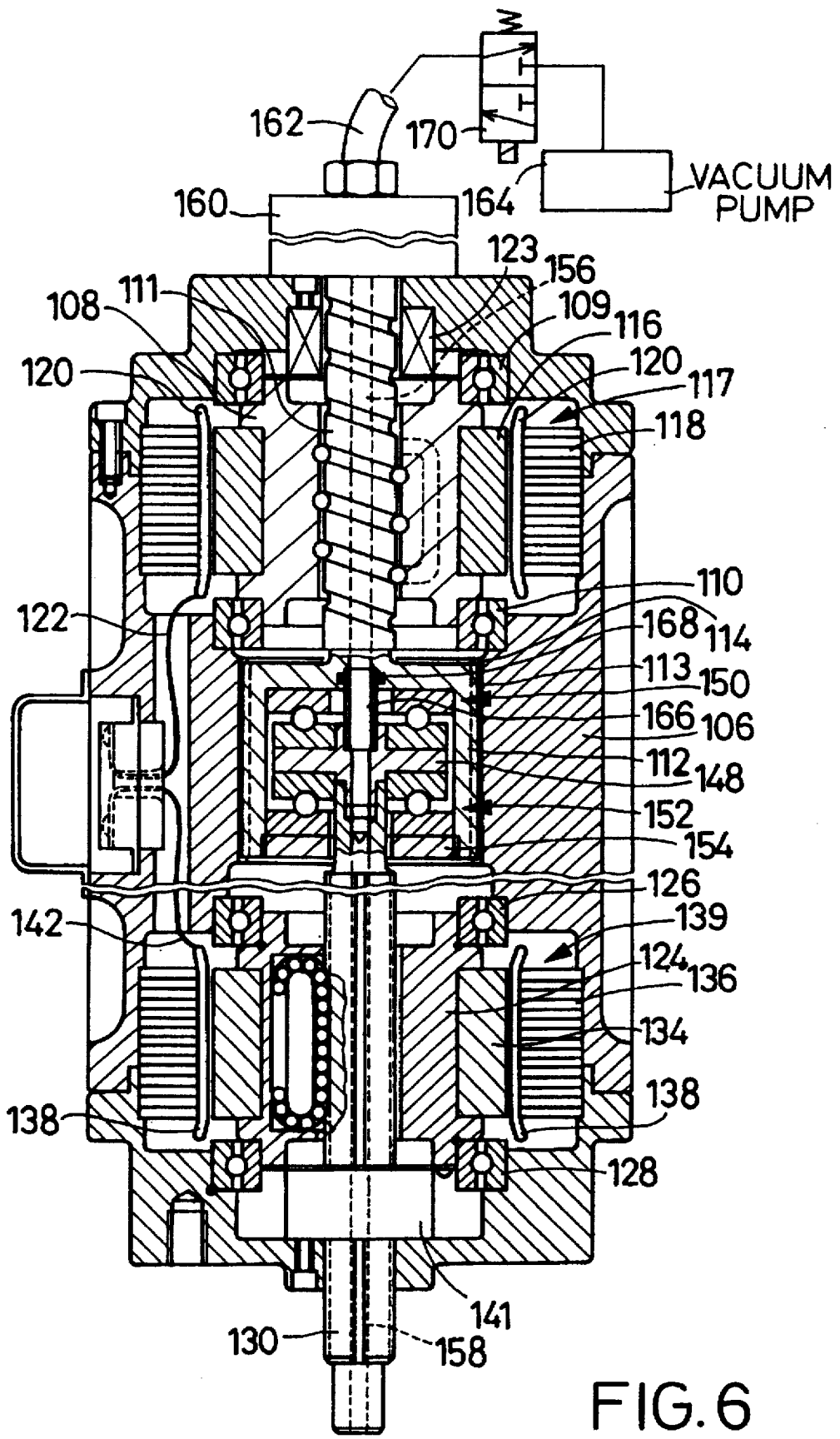
FIG. 6 is front elevational view in cross section of a Z-axis and θ-axis drive motor provided in the first working module of FIG. 5.

Referring to FIG. 6, there will be described the drive motor 98, which consists of a Z-axis drive motor portion and a θ-axis drive motor portion which are integrally assembled as a unit. Each of the Z-axis drive motor portion and the θ-axis drive motor portion is an AC servomotor (brushless DC servomotor).

The drive motor 98 includes ballscrew 111 and spline shaft 130 which have respective center passages 156, 158 formed axially over their entire lengths. The passage 156 is connected to a vacuum pump 164 through a coupling joint 160 and a hose 162. The length of the ballscrew 111 is determined to permit the component placer head 96 to move up and down. Namely, the length of the ballscrew 111 is large enough to ensure that the upper portion of the ballscrew 111 projects a suitable distance upwardly from the upper end of the housing 106 even when the ballscrew 111 is placed in its lowermost position. The projecting end portion of the ballscrew 111 air-tightly engages the joint 160, which has a length large enough to allow the ballscrew 111 to move up and down during operation of the motor 98. The passage 156 is connected at its lower open end to a connector tube 166 air-tightly through a sealing member 168. The connector tube 166 has a lower end portion which is press-fitted in the upper end portion of the passage 158. In this arrangement, the connector tube 166 fixed to the spline shaft 130 is rotatable relative to the ballscrew 111. A solenoid-operated control valve 170 is provided between the hose 162 and the vacuum pump 164 so that the passages 156, 158 are selectively communicated with the vacuum pump 164 or the atmosphere.

As shown in FIG. 5, the component placer head 96 has a body 172 which is removably attached to the lower end portion of the spline shaft 130. The body 172 incorporates a tube holder 176 such that the tube holder 176 is axially slidably movable within the body 172 in the vertical direction. The tube holder 176 carries a suction tube 174 outside the body 172, and is normally held in its lowermost position under a biasing force of a spring. Reference numeral 178 in FIG. 5 denotes an illumination plate 178, which functions to absorb an ultraviolet radiation and generates a visible radiation. A UV lamp is provided below the illumination plate 178 to irradiate the illumination plate 178 with a ultraviolet radiation, so that a visible radiation is emitted in the downward direction toward an electronic component held by the suction tube 174, to facilitate an operation of a component imaging device 272 to obtain an image of the component, as described below in detail. The suction tube 174 and the illumination plate 178 are suitably designed depending upon the shape and dimensions of the electronic component.

The component placer head 96 is movable in the X-axis and Y-axis directions to a desired position within the horizontal plane, by means of movements of the X-axis slide 94 and the Y-axis slide 80. Further, the placer head 96 is movable in the Z-axis direction and rotatable about the Z-axis by means of axial and rotational movements of the spline shaft 130 by the Z-axis and θ-axis drive motor 98. With a reduced pressure applied from the vacuum pump 164 to the suction tube 174 through the passages 156, 158, a selected electronic component is held by the suction tube 174 under suction of the reduced pressure.

The component placer head 96 is movable within a predetermined area in the horizontal plane in which the electronic component held by the suction tube 174 can be placed on the PC board 24. The dimension of this predetermined component placement area in the X-axis direction is slightly larger than a half of the dimension of the first working module 12 in the X-axis direction. In other words, the X-axis dimension of the predetermined area of movement of the placer head 96 is slightly larger than the distance of movement of the PC board 24 by the upstream one of the two belt conveyors 64 of the conveyor device 56 described above. That is, the component placing device 58 is positioned above the upstream belt conveyor 64 so that the predetermined area of movement of the placer head 96 indicated at R in FIG. 2 is almost aligned with the upstream belt conveyor 64 in the X-axis direction, as indicated by two-dot chain line in FIG. 2.

The component supply device 60 of the first working module 12 has a plurality of component supply cartridges 190, as shown in FIG. 2. Each component supply cartridge 190 is adapted to receive a reel 192 (FIG. 3) which accommodates a roll of a component carrier tape which holds a multiplicity of electronic components or chips. The component carrier tape has multiple recesses, which are open in one of the opposite surfaces of the tape and which are spaced part from each other in the longitudinal direction of the tape at a predetermined spacing interval. The recesses accommodate respective electronic components and are closed by a covering tape. In operation of the component supply cartridge 190, the component carrier tape is intermittently fed by a suitable feed device, from the reel 192 at a pitch corresponding to the spacing interval of the component accommodating recesses of the tape. As the component carrier tape is fed, the covering tape is removed to permit an access to the electronic components contained in the recesses, so that these components are successively fed one after another to a predetermined supply position P indicated in FIG. 3.

In FIG. 3, the X-axis slide 94 placed at its fully advanced position in the Y-axis direction is shown in two-dot chain line. This fully advanced position is beyond the component supply position P in the first working module 12, on the side of the component supply device 60 in the Y-axis direction. In this first working module 12 wherein the placer head 96 receives the electronic components at the supply position P, the X-axis slide 94 or the placer head 96 need not be moved to the fully advanced position indicated in two-dot chain line in FIG. 3. However, the placer head 96 can be moved to that fully advanced position, since the structural arrangement of the device for positioning the placer head 96 in the first working module 12 is the same as in the second and third working modules 14, 16 in which the placer head 96 receives the electronic components at its fully advanced position.

The plurality of component supply cartridges 190 are removably mounted on a support block 196 provided on the bed 54, such that the cartridges 190 are arranged in the X-axis direction so as to extend in parallel in the Y-axis direction, as indicated in FIGS. 1 and 2.

Figure 7:
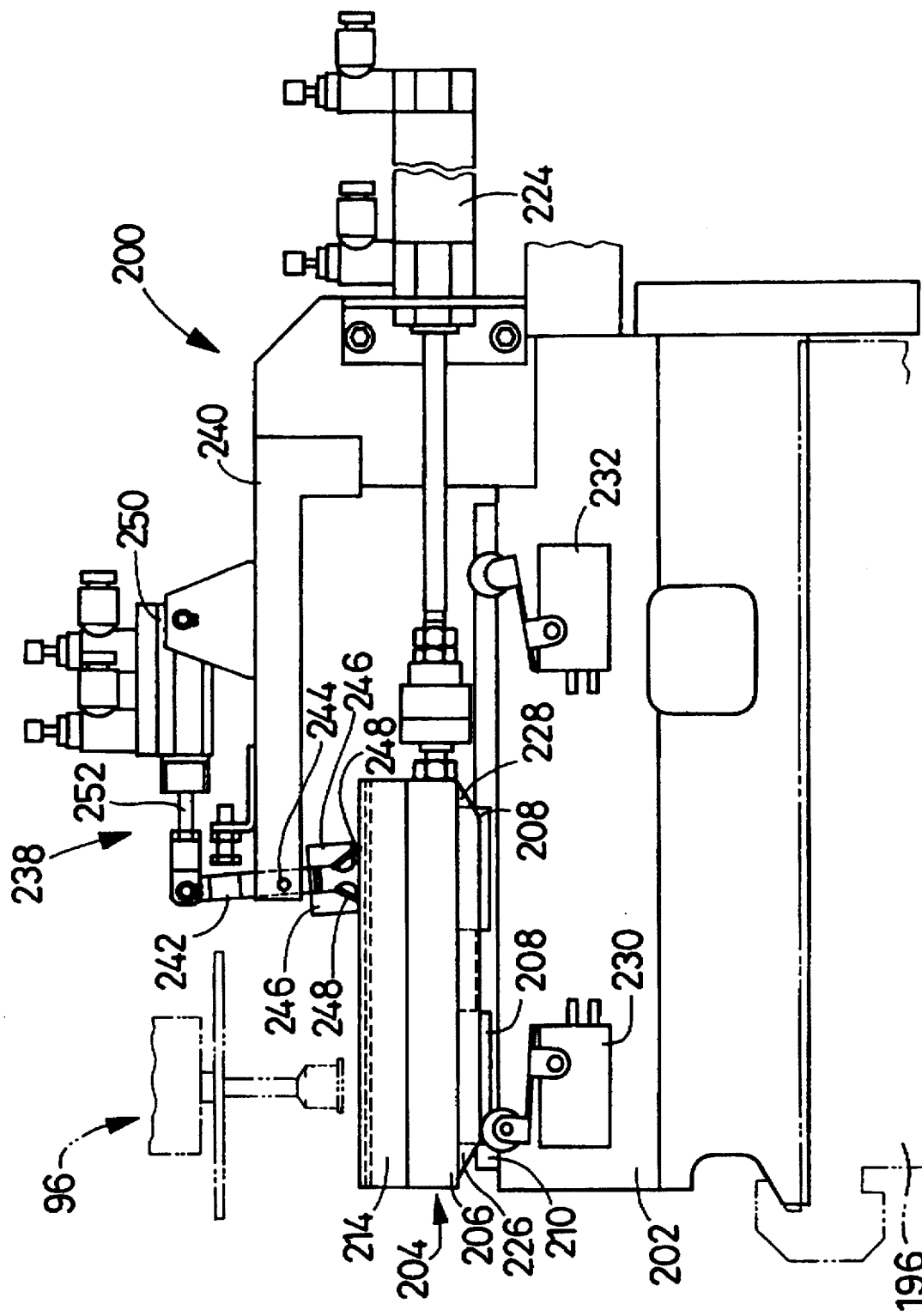
FIG. 7 is a front elevational view of a flux coating device provided in the first working module of FIG. 5.
Figure 8:
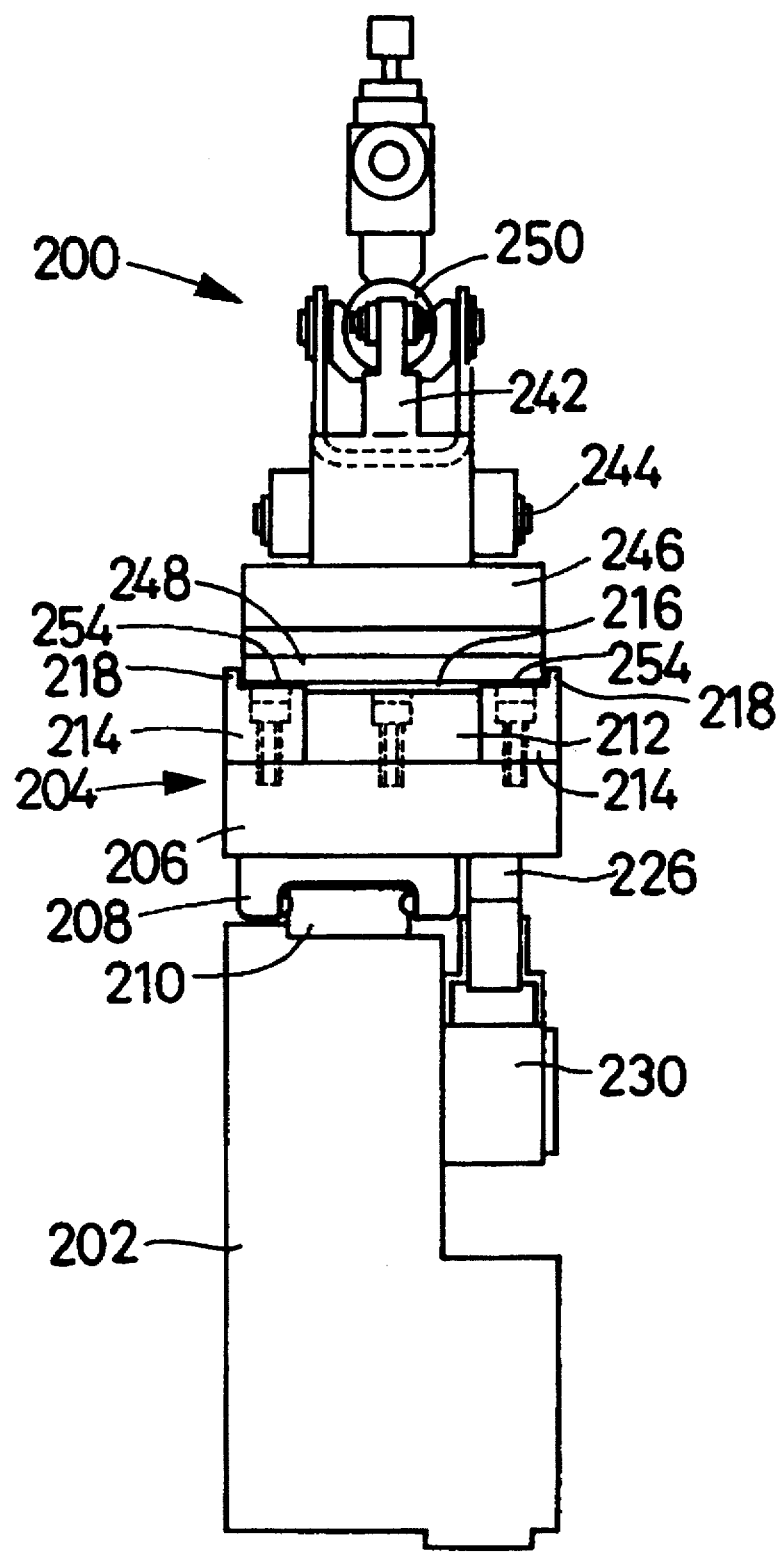
FIG. 8 is a side elevational view of the flux coating device.

Also mounted on the support block 196 is a flux coating device 200 shown in FIGS. 7 and 8, such that the flux coating device 200 is adjacent to the end of the array of the component supply cartridges 190 on the side of the second working module 14. The rightmost cartridge 190 as seen in FIGS. 1 and 2 is used to supply flip chips or ball-grid arrays (BGA) or other electronic components which have a relatively large width dimension in the X-axis direction. The flux coating device 200 located adjacent to this rightmost cartridge 190 has the same width dimension as the rightmost cartridge 190, and is positioned and clamped on the support block 196 by the same device as used for the rightmost cartridge 190.

The flip chips and BGA are semiconductor chips which have electrodes formed on their bottom surfaces by solder bumps.

As shown in FIGS. 7 and 8, the flux coating device 200 has a body 202 in the form of a plate having a relatively small width. The body 202 is mounted on the support block 196, so as to extend in the Y-axis direction. On the body 202, there is mounted a flux holder 204 such that the flux holder 204 is movable on the body 202 in the Y-axis direction.

The flux holder 204 has a base 206 in the form of an elongate plate provided with a pair of guide blocks 208 at its lower surface. The guide blocks 208 slidably engage a guide rail 210 which is formed on the body 202 so as to extend in the Y-axis direction.

A bottom plate 212 is secured to a widthwise central portion of the upper surface of the base 206 such that the bottom plate 212 extends in the Y-axis direction. To the upper surface of the base 206 are also secured two side frame plates 214 such that the side frame plates 214 are adjacent to the opposite side surfaces of the bottom plate 212 which are opposite to each other in the X-axis direction. The side frame plates 214 have a larger height or thickness dimension in the vertical or Z-axis direction, and cooperate with the bottom plate 212 to define a recess 216 for accommodating a flux. The height or thickness dimension of the bottom plate 212 or the depth of the recess 212 is determined so that the solder bumps of the electronic component supplied from the rightmost component supply cartridge 190 are coated with a suitable amount of the flux in the recess 216 when the solder bumps of the electronic component held by the suction tube 174 of the placer head 96 are contacted with the upper surface of the bottom plate 212. Therefore, the depth of the recess 216 may be changed by replacing the bottom plate 212 with the one having a desired thickness dimension, without changing the side frame plates 214. The bottom plate 212 also functions to position the side frame plates 214 relative to the base 206. Each of the two side frame plates 214 has an upwardly projecting lip 218 formed along an outer upper edge thereof remote from the bottom plate 212, so as to extend in the Y-axis direction.

The flux holder 204 is advanced and retracted in the Y-axis direction by an air cylinder 224 attached to the rear end of the body 202. The fully advanced and fully retracted positions of the flux holder 204 are defined by respective dogs 226, 228 formed integrally with the base 206, and are detected by respective limit switches 230, 232 when these switches are turned on by the corresponding dogs 226, 228. The air cylinder 224 is controlled according to the output signals of these limit switches 230, 232 to move the flux holder 204 at the fully advanced or retracted position.

The Z-axis drive motor portion of the drive motor 98 will be described first.

The drive motor 98 has a housing 106. In an upper part of the housing 107, a nut 108 is supported by bearings 108, 110 such that the nut 108 is rotatable about the vertical or Z-axis. The nut 108 engages the ballscrew 111. A bearing retainer 112 is formed below and integrally with the ballscrew 111. The bearing retainer 112 is a cylindrical member which is closed at its upper end and open at its lower end. A spline 113 is formed on the outer circumferential surface of the bearing retainer 112. The spline 113 engages a splined hole 114 formed in the housing 106, whereby the ballscrew 111 is prevented from rotating. The bearing retainer 112 will be described in detail.

A permanent magnet 116 is fixed to the outer circumferential surface of the nut 108. The permanent magnet 108, which serves as a rotor of an AC servomotor, takes the form of a ring having N and S poles which are alternately arranged in the circumferential direction.

An annular stator core 117 is fixed in the housing 106, more precisely, fixedly disposed radially outwardly of the permanent magnet or rotor 116. The stator core 117 is a laminated core member 118 in which a plurality of coils 120 are accommodated. The rotor 116 and the stator core 117 constitutes the 3-phase AC servomotor as the Z-axis drive motor portion of the drive motor 98. The coils 120 are connected to a servo driver through a cable 122. The servo driver controls an electric current to be applied to the coils 120 for controlling the angular position of the rotor 116 (nut 108), to thereby control the axial position of the ballscrew 111.

An encoder 123 is fixed to the housing 123, in the vicinity of the nut 108. The encoder 123 generates pulses during rotation of the nut 108. The pulses are applied, as feedback pulses, to an error counter provided in the servo driver indicated above. The error counter also receives command pulses, and compares the number of the feedback pulses from the encoder 123 with the number of the command pulses. The error counter generates an output signal corresponding to the difference of these numbers, and the servo driver control the electric current to be applied to the coil 120, according to the output signal of the error counter, to thereby control the rotation of the nut 108. When the positive command pulses are applied to the error counter, the nut 108 is rotated in the forward direction, at a speed proportional to the frequency of the command pulses, by an angle proportional to the number of the command pulses. When the negative command pulses are applied to the error counter, the nut 108 is rotated in the reverse direction.

Then, the θ-axis drive motor portion of the drive motor 98 will be described.

In a lower part of the housing 106, a ball spline member 124 is supported by bearings 126, 128 such that the ball spline member 124 is rotatable about the same axis as the ballscrew 111. The ball spline member 124 engages the spline shaft 130, so that the spline shaft 130 is rotated with the ball spline member 124.

A permanent magnet 134 similar to the permanent magnet 116 is fixed to the outer circumferential surface of the ball spline member 124. The permanent magnet 134 serves as a rotor of an AC servomotor. An annular stator core 139 similar to the stator core 117 is fixed in the housing 106, more precisely, fixedly disposed radially outwardly of the permanent magnet or rotor 134. The stator core 139 is a laminated core member 136 in which a plurality of coils 138 are accommodated. The rotor 134 and the stator core 139 constitutes the 3-phase AC servomotor as the θ-axis drive motor portion of the drive motor 98. The coils 138 are connected to a servo driver through a cable 142. The servo driver controls an electric current to be applied to the coils 138, depending upon the command pulses and feedback pulses from an encoder 141, for controlling the angular position of the ball spline member 124 to thereby control the angular position of the spline shaft 130.

An upper part of the spline shaft 130 has a radially outwardly extending flange portion 148, which engages the bearing retainer 112 indicated above. Bearings 150, 152 are disposed in contact with the upper and lower surfaces of the flange portion 148. The flange portion 148 and the bearings 150, 152 are held in position within the bearing retainer 112, with a cap member 152 threaded to the open end portion of the bearing retainer 112. Thus, the flange portion 148 is connected to the bearing retainer 112 through the bearings 150, 152, and the ballscrew 111 fixed to the bearing retainer 112 is connected to the spline shaft 130 at the flange portion 148 such that the ballscrew 111 and the bearing retainer 112 are rotatable and axially immovable relative to each other. In the present arrangement, an operation of the Z-axis drive motor portion will cause the ballscrew 111 and the spline shaft 130 to axially move as a unit, while an operation of the θ-axis drive motor portion will cause the spline shaft 130 to be rotated relative to the ballscrew 111. With the controlled electric currents applied to the coils 120, 138 at different times, the axial movement and rotation of the spline shaft 130 take place sequentially, one after the other. With the electric currents applied to the coils 120, 138 simultaneously, the axial movement and rotation of the spline shaft 130 take place simultaneously. The spline shaft 130 has a length which is determined so that the spline shaft 130 is not disengaged from the ball spline member 124 when the component placer head 96 is moved up and down.

Above the flux holder 204, there is provided a squeezing device 238. A bracket 240 is fixed to a rear portion of the body 202 of the flux coating device 200. The bracket 240 has an extension which extends toward the flux coating device 200 in the Y-axis direction and which carries at its distal end a pivot plate 242. The pivot plate 242 is pivotable about a shaft 244 which is parallel to the X-axis direction. The pivot plate 242 carries a pair of squeezer holders 246 at its lower end portion extending below the extension of the bracket 240. The squeezer holders 246 are have respective squeezers 248 fixed thereto. The squeezers 248 are generally sheet-like members made of a hard rubber, synthetic resin or metallic material. The sheet-like squeezers 248 are inclined with respect to the vertical plane parallel to the X-axis direction, such that the distance between the squeezers 248 increases in the downward direction.

To the upper end portion of the pivot plate 242 extending above the above-indicated extension of the bracket 240, there is pivotally connected a piston rod 252 of an air cylinder 250 which is attached to the bracket 250. Advancing and retracting movements of the piston rod 252 cause the pivot plate 242 to pivot in the counterclockwise and clockwise directions, respectively, as seen in the plane of FIG. 7, so that one of the two squeezers 248 is contacted with the upper surfaces of the side frame plates 214. Namely, the upper surfaces of the side frame plates 214 serve as sliding surfaces 254 on which the squeezers 248 slidably move.

To fill the recess 216 with a flux, a mass of the flux is placed in a portion of the recess 216 which is ahead of the squeezers 248, by a flux supply device (not shown) while the flux holder 204 is placed at its fully advanced position of FIG. 7. Then, the pivot plate 242 is pivoted clockwise by the air cylinder 250 so that the rear one of the two squeezers 248 is in contact with the sliding surfaces 254 of the side frame plates 214, while the front squeezer 248 is spaced away from the sliding surfaces 254. In this condition, the flux holder 204 is retracted by the air cylinder 224, so that the flux mass is spread throughout the recess 216.

After the retracting movement of the flux holder 204, the pivot plate 242 is pivoted counterclockwise so that the front squeezer 248 is in contact with the sliding surfaces 254 while the rear squeezer 248 is part from the sliding surfaces 254. Then, the flux holder 204 is advanced to flatten the flux mass in the recess 216, so that the flux mass takes the form of a layer. Thereafter, the flux coating device 200 is moved in the X-axis direction so that the recess 216 is located at a flux coating position aligned with the component supply position of the rightmost component supply cartridge 190. The lips 218 provided along the outer edges of the side frame plates 214 function to prevent the flux mass from being removed out of the recess 216.

Figure 9:
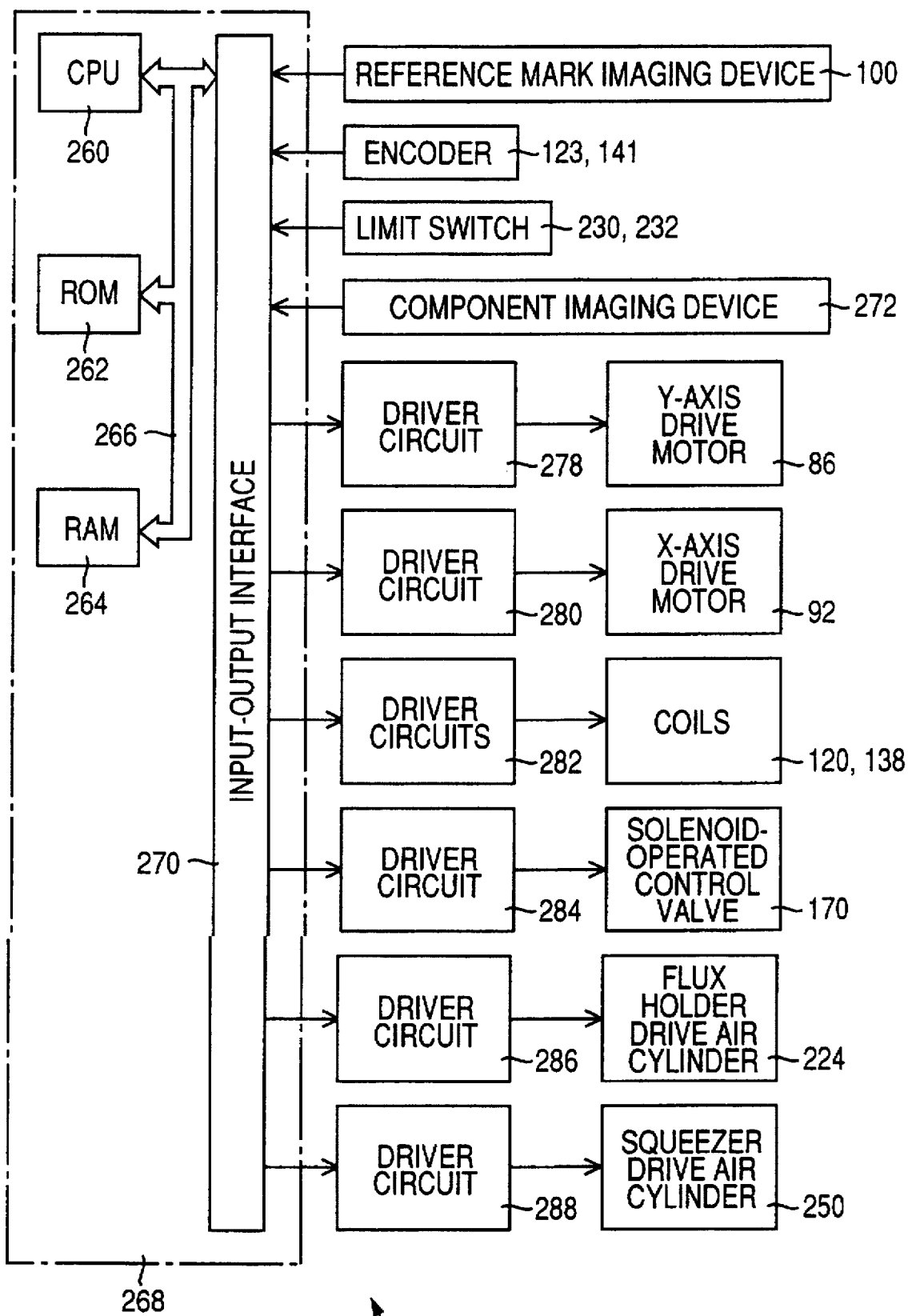
FIG. 9 is a block diagram illustrating a controller of the first working module.
Figure 10:
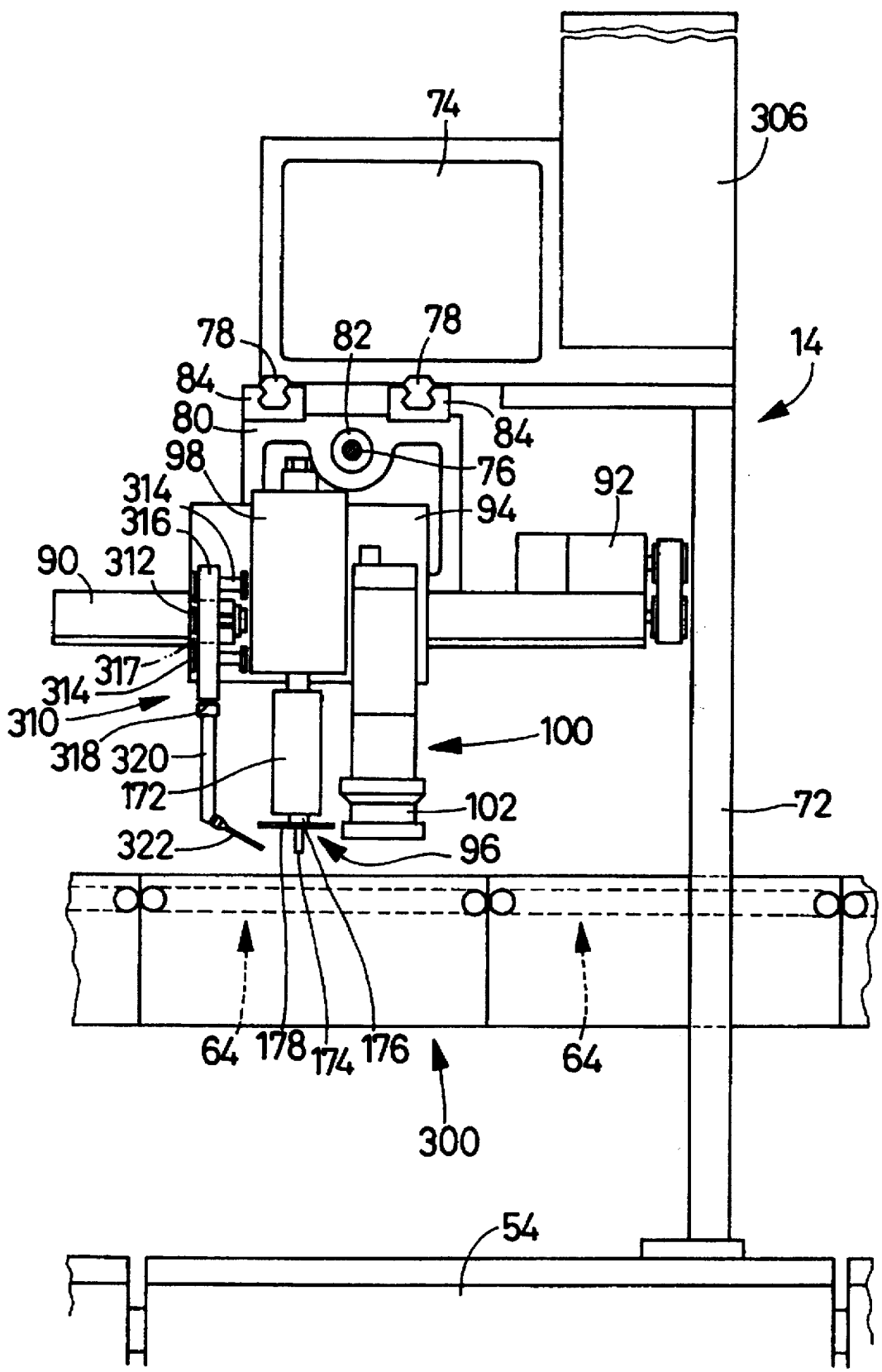
FIG. 10 is a front elevational view of a flux permeating device provided in a second working module of the fabricating system of FIG. 1.

The controller 62 for the first working module 12 is principally constituted by a computer 268 which incorporates a central processing unit (CPU) 260, a read-only memory (ROM) 262, a random-access memory (RAM) 264, and a bus 266 interconnecting those elements, as shown in the block diagram of FIG. 9. To the bus 266, there is connected an input-output interface 268 to which are connected the encoders 123, 141, limit switches 230, 232, reference mark imaging device 100 and component imaging device 272. The component imaging device 272 includes a CCD camera, and is disposed between the array of the component supply cartridges 190 and the conveyor device 56.

To the input-output interface 270, there are also connected driver circuits 278, 280, 282, 284, 286 and 288 for driving the Y-axis drive motor 86, X-axis drive motor 92, coils 120, 138 of the Z-axis and θ-axis drive motor 92, solenoid-operated control valve 170, and solenoid-operated directional control valves for the air cylinders 224, 250, respectively. The ROM 262 stores various control programs including programs necessary for placing the electronic components on the PC boards 24.

There will next be described the second working module 14.

As shown in FIGS. 1 and 2, the second working module 14 includes a bed 298, and a conveyor device 300, a component placing device 302, a component supply device 304 and a controller 306, which are provided on the bed 298. The conveyor device 300 is structurally identical with the conveyor device 56 of the first working module 12. The second working module 14 has the same dimension in the X-axis direction as the first working module 12.

The component placing device 302 is structurally identical with the component placing device 58 of the first working module 12, except that the X-axis slide 94 in the second working module 14 carries a flux applying device 310 as well as the Z-axis and θ-axis drive motor 98, component placer head 96 and reference mark imaging device 100.

The X-axis slide 94 has a ballscrew 312 and a pair of guide rails 314 which extend in the X-axis direction. The X-axis slide 94 carries an air cylinder 316 such that the air cylinder 316 is supported by a suitable support member which has a nut engaging the ballscrew 312 and which slidably engages the guide rails 314. The ballscrew 312 is rotated by a stepping motor 317 mounted on the X-axis slide 94 via a suitable support member. Rotation of the ballscrew 314 causes the air cylinder 316 to move in the X-axis direction.

The air cylinder 316 has a piston rod which extends downward and which carries a flux container 320 at its lower end. The flux container 320 takes the form of a cylindrical sleeve and carries a flux delivery tube 322 at its lower end. The delivery tube 322 communicates with the flux container 320 and is inclined so as to point to the lower end of the suction tube 174 of the component placer head 96. The flux container 320 is movable up and down in the Z-axis by the air cylinder 316 and is movable right and left in the X-axis direction together with the air cylinder 316.

The flux container 320 accommodates a liquid flux, and is connected to a compressed air source. A solenoid-operated control valve 324 (FIG. 13) is provided between the air pressure source and the flux container 320. When the flux is applied to the electronic component held by the suction tube 174, the control valve 324 is operated for communication of the compressed air source with the flux container 320, so that the flux is forced to be fed by compressed air from the flux container 320 into the delivery tube 314. The amount of the flux to be delivered at one time is extremely small, for example, about 10 micro litter, and the amount of the compressed air is suitably determined depending upon the required amount of delivery of the flux.

The component supply device 304 will be described next.

This component supply device 304 is adapted to supply electronic components such as flip chips and BGA (ball grid arrays) indicated above, and quad-flat packages (QFP), connectors and sockets. The quad-flat packages are rectangular semiconductor chips which have lead wires extending from the four sides of the rectangle.

Figure 11:
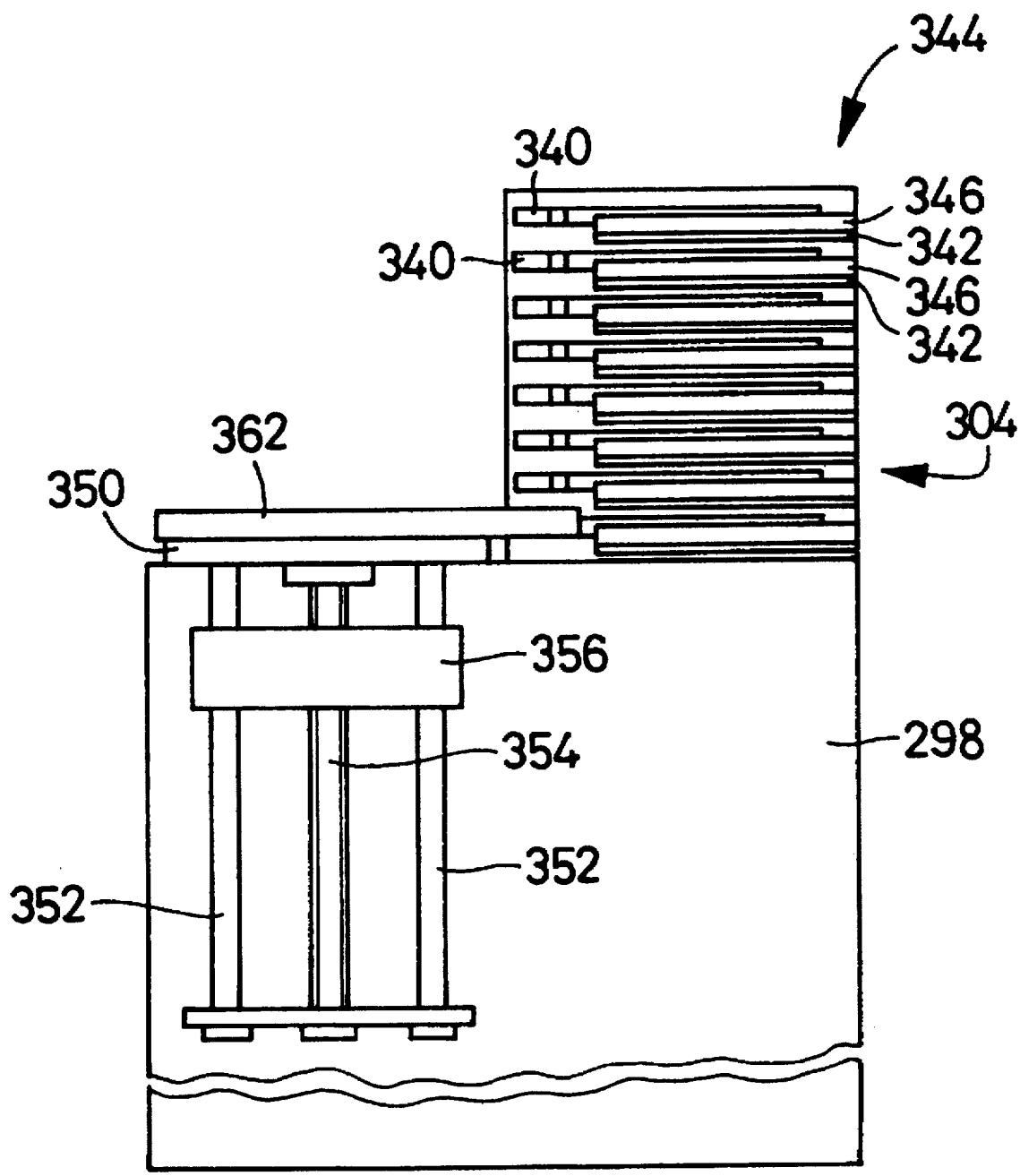
FIG. 11 is a front elevational view of a component supply device provided in a third working module of the fabricating system of FIG. 1.
Figure 12:
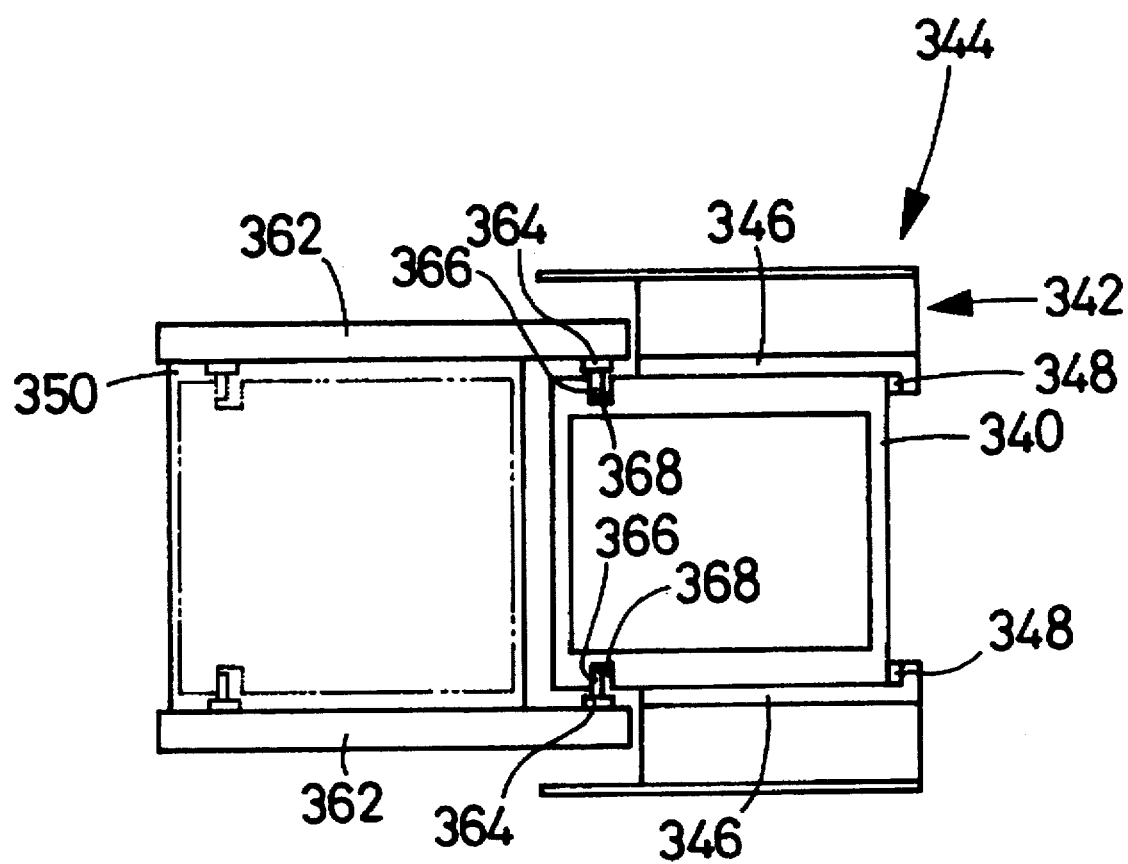
FIG. 12 is a plan view of the component supply device of FIG. 11.

The component supply device 304 is adapted to receive the electronic components or chips accommodated in component supply pallets 340 as shown in FIGS. 11 and 12. Each of the pallets 340 has a multiplicity of recesses arranged in a matrix. The recesses accommodate respective electronic components. The pallets 340 are supported by respective racks 342 in a pallet storage 344. The racks 342 are spaced from each other in the vertical direction in the pallet storage 344. The pallets 340 are movable on the respective racks 342 in the X-axis direction. Each rack 342 has a pair of guide rails 346 extending in the X-axis direction, as shown in FIG. 12, for guiding the pallet 340. The pallet 340 is supported on the corresponding rack 342, in contact with two stoppers 348 which are formed on the upper surfaces of the guide rails 346 and which have a relatively small height dimension. The top of the pallet storage 344 is located below a component transfer position at which the placer head 302 receives the electronic components from the component supply device 304.

Adjacent to the pallet storage 344 in the X-axis direction, there is provided a pallet support block 350. A pair of guide rods 352 and a ballscrew 354 are fixed to the lower surface of the pallet support block 350, so as to extend in the vertical direction. The guide rods 350 slidably engage a support member 356 secured to the bed 298, and the ballscrew 354 engages a nut fixed to the support member 356. The nut is rotated by a motor 358 (FIG. 13) so that the pallet support block 350 is movable up and down through the ballscrew 354, between predetermined uppermost and lowermost positions.

Two air cylinders 362 without piston rods are fixed to the pallet support block 350 such that the air cylinders 362 are adjacent to the opposite side edges of the pallet support block 350 which are parallel with the X-axis. Each air cylinder 362 has an internal piston, and an external movable member 364 which protrudes from the piston so as to extend through the cylindrical wall in which the piston is slidably moved. The movable member 364 is movable with the piston while air-tightness between the movable member 364 and the cylindrical wall is maintained. An engaging member 366 engages the movable member 364.

The two air cylinders 363 extend into the pallet storage 344, so that the engaging members 366 are engageable with a pair of cutouts 368 formed in each of the component supply pallets 340. The cutouts 368 are formed through the entire thickness of each pallet 340. The cutouts 368 provided in all the pallets 340 in the pallet storage 344 are aligned with each other in the horizontal plane, when the pallets 340 are positioned in place in abutting contact with the stoppers 348. In this arrangement, the engaging members 366 engaging the movable members 364 of the air cylinders 362 can be moved through the cutouts 368 of all the pallets 340 when the pallet support block 350 is vertically moved. In other words, the engaging members 366 of the air cylinders 362 can be brought into engagement with the cutouts 368 of the selected pallet 340 which accommodates the electronic components to be supplied by the component supply device 304. With the pistons of the air cylinders 362 moved in the direction from the pallet storage 344 toward the pallet support block 350, the selected pallet 340 is loaded onto the pallet support block 350 by movements of the engaging members 366 with the pistons.

After the pallet support block 350 receives one of the pallets 340 from the pallet storage 344, the pallet support block 350 is moved to its uppermost position or component transfer position, at which the electronic components accommodated in the pallet 340 are successively picked up by the placer head 96 of the component placing device 302. The component transfer or uppermost position of the pallet support block 350 is higher than the top of the pallet storage 344.

When any pallet 340 is removed from the pallet storage 344 and replaced by another pallet (which is loaded with a set of electronic component of the same kind or another kind), the pallet support block 350 is moved down to its lowermost position lower than the pallet storage 344, to permit the pallet 340 to be taken out from the pallet storage 344 on the side of the pallet support block 350. However, the pallet 340 may be removed on the side remote from the pallet support block 350, while clearing the stoppers 348 whose height is relatively small.

Figure 13:
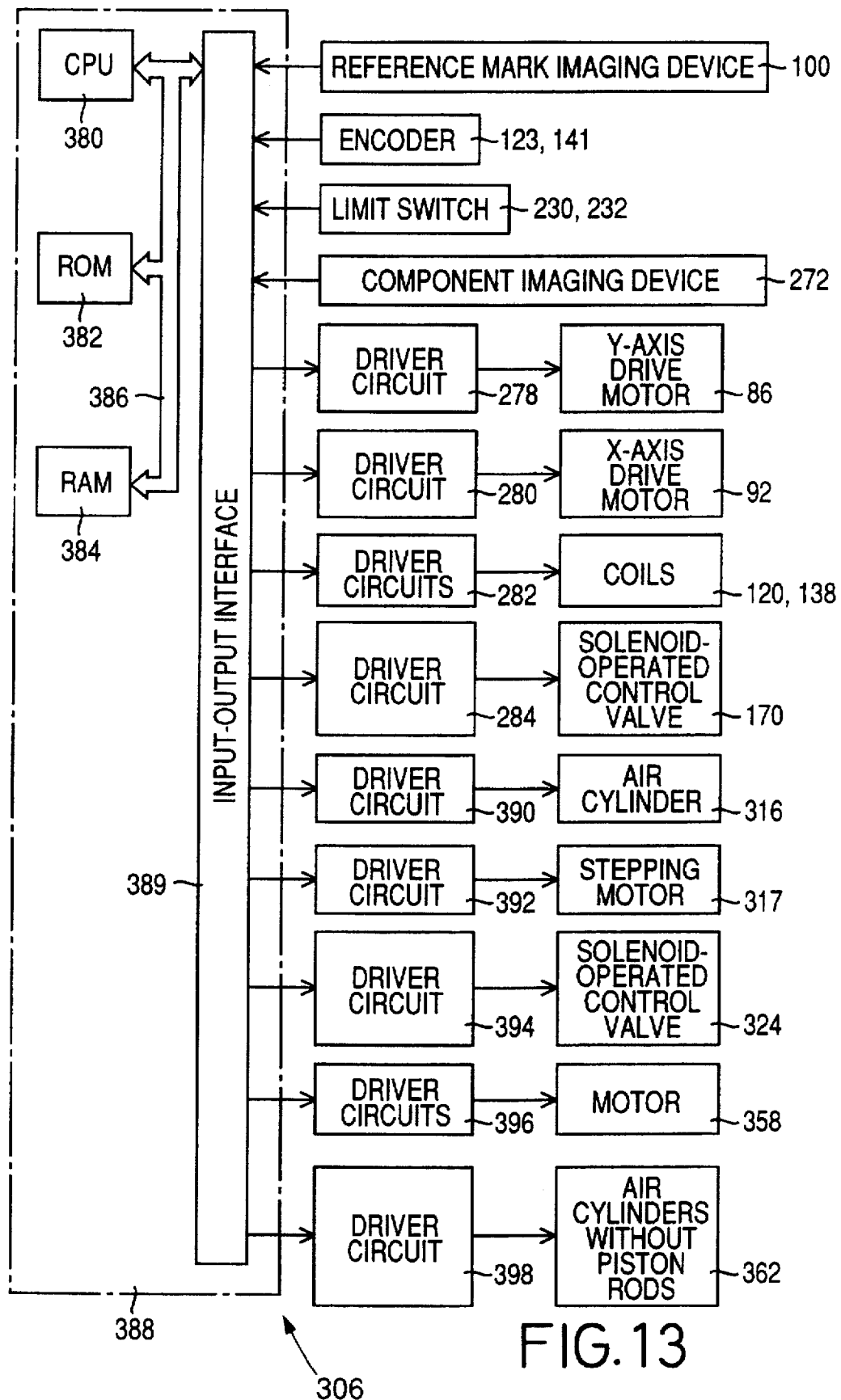
FIG. 13 is a block diagram illustrating a controller of the third working module which includes the component supply device of FIGS. 11 and 12.

The controller 306 for the second working module 14 is principally constituted by a computer 388 which incorporates a central processing unit (CPU) 380, a read-only memory (ROM) 382, a random-access memory (RAM) 384, and a bus 386 interconnecting these elements, as indicated in the block diagram of FIG. 13. To the bus 386 is connected an input-output interface 389, to which are connected the conveyor device 300, component placing device 2302 and component supply device 304.

The controller 306 is identical with the controller 62 for the first working module 12, except that there are connected to the input-output interface 389 the air cylinder 316, stepping motor 317, solenoid-operated control valve 324, motor 358 and rodless air cylinders 362 through respective driver circuits 390, 392, 294, 296 and 398.

The third working module 16 is identical with the second working module 14, except that the third working module 16 does not have the flux applying device 310 and that unlike the controller 306 shown in FIG. 13, the controller (not shown) for the third working module 16 does not control the air cylinder 316, stepping motor 317 and solenoid-operated control valve 324.

The fourth working module 18 will then be described.

The fourth working module 18 has a conveyor device 420 and a component placing device 422, which are provided on a bed 423 and are similar to the conveyor device 56 and component placing device 58 of the first working module 12. The dimension of the third working module 18 in the X-axis direction is the same as that of the working modules 12, 14, 16.

The fourth working module 18 further has a component supply device 424 which is provided with a plurality of component supply trays. These component supply trays are accommodated in respective racks provided in a component supply console. As shown in FIG. 2, a shuttle 426 is provided for receiving an electronic component from a component pick-up robot which is movably disposed adjacent to the component supply console, to receive the electronic component from one of the component supply trays. The component pick-up robot is movable along the X-, Y- and Z-axes and has a suction head for holding the electronic component under vacuum suction. The shutter 426 which holds the electronic component is moved to a position Q indicated in FIG. 2, at which the electronic component is transferred to the suction tube 174 of of the placer head 96. Since the component supply device 424 is too large to be mountable on the bed 423, this device 424 is mounted on a bed 428 adjacent to the bed 423, as indicated in FIGS. 1 and 2.

Figure 14:
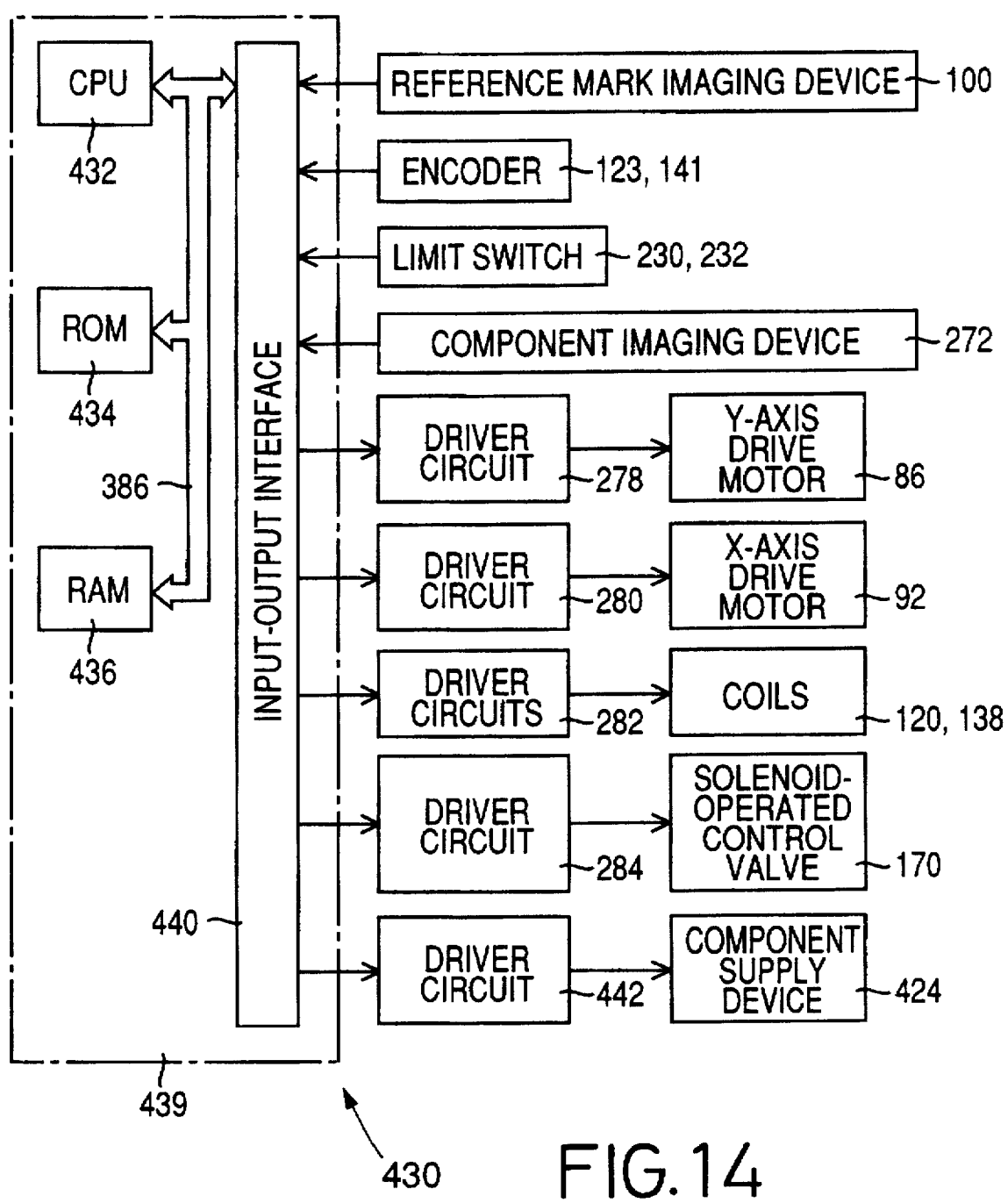
FIG. 14 is block diagram illustrating a controller of a fourth working module of the assembly of FIG. 1, which is the most downstream working module.

The fourth working module 18 is controlled by a controller 430, which is principally constituted by a computer 439 which incorporates a central processing unit (CPU) 432, a read-only memory (ROM) 434, a random-access memory (RAM) 436, and a bus 438 interconnecting these components, as shown in the block diagram of FIG. 14. To an input-output interface 440 connected to the bus 438, there are connected various components of the conveyor device 420 and component placing device 422, as in the first working module 12. Further, the component supply device 424 is connected to the input-output interface 440 through a driver circuit 442.

Figure 15:
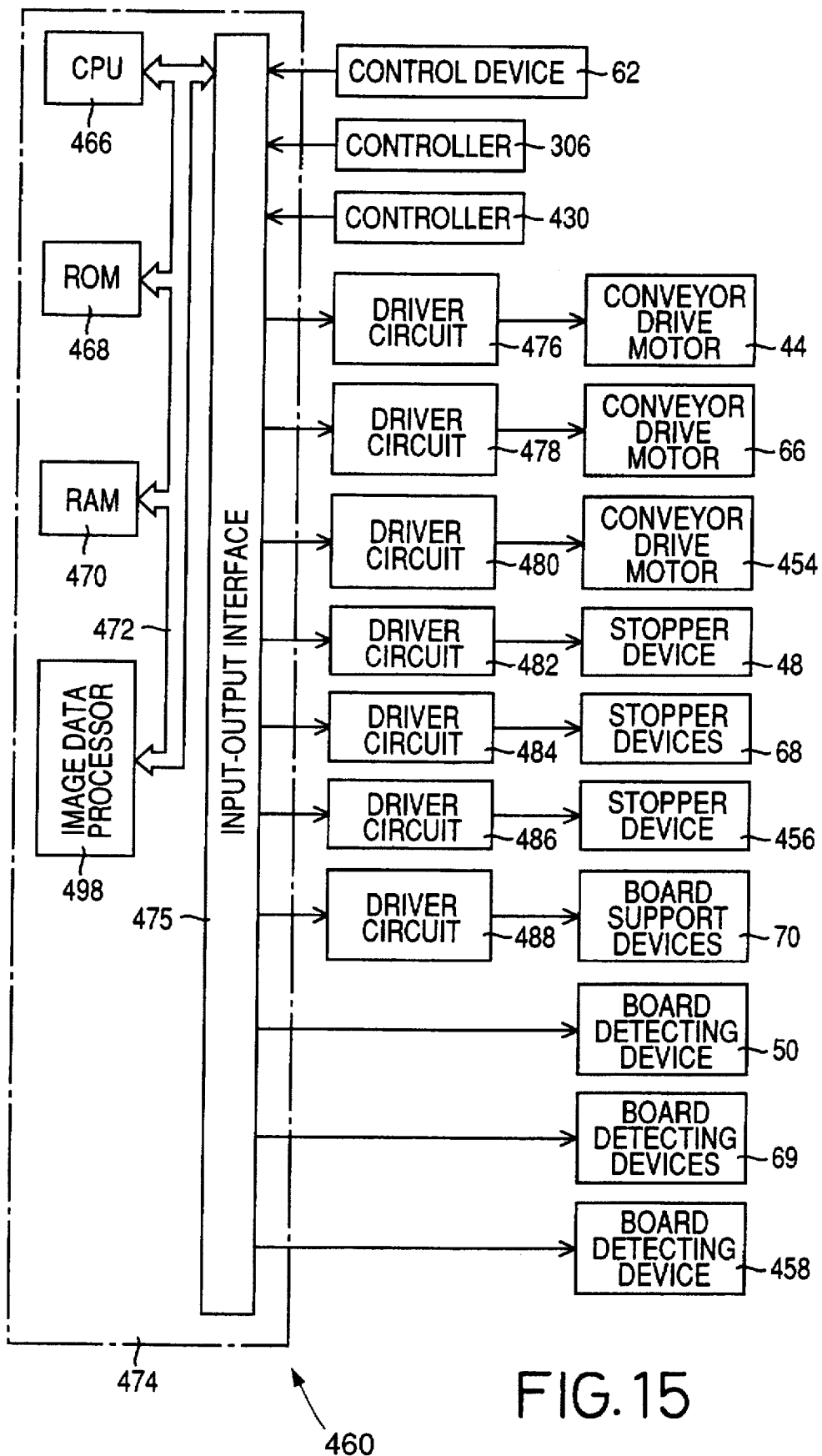
FIG. 15 is a block diagram illustrating a coordinating control device of the fabricating system.

The unloading module 20 has a conveyor device 452 similar to the conveyor device 26 of the loading module 10, and is mounted on the bed 428 together with the component supply device 424. Like the conveyor device 26, the conveyor device 452 is a belt conveyor including a pair of endless belts driven by a conveyor drive motor 454 (FIG. 15). The conveyor device 452 are provided with a stopper device 456 (FIG. 15) similar to the stopper device 48 of the loading module 10, to stop the PC board 24, and a board detecting device 458 similar to the board detecting device 50, to detect the PC board 24. The conveyor device 452 is adapted to transfer the PC board 24 into a heating furnace located downstream of the unloading module 20. The conveyor drive motor 454, stopper device 456 and board detecting device 458 are controlled by a controller similar to the controller 62.

On the bed 22 of the loading module 10, there is provided a mount 462 at a position higher than that of the conveyor device 26. On the mount 462 is mounted a coordinating control device 460 which coordinates the controllers 62, 306, 430 for the modules 12, 14, 16, 18, 20. The coordinating control device 460 is principally constituted by a computer 474 which incorporates a central processing unit (CPU) 466, a read-only memory (ROM) 468, a random-access memory 470, and a bust 472 interconnecting these components, as indicated in the block diagram of FIG. 15. An input-output interface 475 is connected to the bus 472. To the input-output interface 475, there are connected the individual controllers 62, 306, 430.

To the bus 472, there are also connected various devices such as: a data input device which is operated by the user to enter commands or information necessary to command and control the control device 460; a display device which provides information indicating the operating states of the present transfer type circuit board fabricating assembly, and information for prompting the user to enter necessary information; and an external storage device such as a disk drive.

The input-output interface 475 receives the output signals of the board detecting devices 50, 69, 458, and applies control signals through driver circuits 476, 478, 480, 482, 484, 486, 488 to the conveyor drive motor 44 of the conveyor device 26, conveyor drive motors 66 of the conveyor devices 56, 300, 420, conveyor drive motor 454 of the conveyor device 452, stopper devices 48, 68, 456 and board support devices 70, to control the individual modules 10, 12, 14, 16, 18, 20. The conveyor drive motors 66 are controlled so that the acceleration of the components moved by these motors 66 do not exceed 1 G, in order to prevent dislocation of the electronic components on the PC board 24 due to a large inertia, since the electronic components are held in place on the PC board 24 with a small retention force by means of a creamy solder or other provisionally fixing agent.

To the bus 472 of the coordinating control device 460, there is connected an image data processor 498 for processing image data from the reference mark imaging devices 100 and component imaging devices 272 through the controllers 62, 306, 430. The image data processor 498 are adapted to calculate positioning errors ΔXp, ΔYP and Δθp of the PC board 24 placed on the lifter 71 (left one of the two lifters 71 as seen in FIG. 5), and positioning errors ΔXe, ΔYe and Δθe of the electronic component held by the suction tube 174 of the component placer head 96. The calculated errors ΔXp, ΔYP, Δθp, ΔYe and Δθe are fed to the individual controllers 62, 306, 430. The positioning errors ΔXp, ΔYP are errors of the X-axis and Y-axis positions of the PC board 24 in the horizontal or X–Y plane, and the positioning error Δθp is an error of the angular position of the PC board 24 about the Z-axis. Similarly, the positioning errors ΔXe, ΔYe are errors of the X-axis and Y-axis positions of the electronic component in the horizontal or X–Y plane, and the positioning error Δθe is an error of the angular position of the electronic component about the Z-axis.

The ROM 468 of the coordinating control device 460 stores working schedule information relating to working operations to be performed by the individual working modules 12, 14, 16, 18. The working schedule information includes basic information indicative of the types of electronic circuits to be formed on the PC board 24, the numbers of the PC boards 24 on which those types of electronic circuits are to be formed, and the order in which the different types of electronic circuits are to be formed on the PC boards 24. According to the basic information, the use or operator of the present transfer type electronic circuit fabricating assembly stores circuit board fabricating programs into the RAM 470 of the control device 460, before a circuit board fabricating operation is performed by the present fabricating assembly. For example, the circuit board fabricating programs include: data indicative of the component supply cartridges 190 from which the electronic components are supplied to the first working module 12; data indicative of the component supply pallets 340 from which the electronic components are supplied to the second working module 14; and data indicating whether the electronic components are coated with a flux or not. In a broad sense, the term "working schedule information" includes such data.

At the loading module 10 on which the coordinating control device 460 is provided, there are provided devices which are commonly used by the modules 12, 14, 16, 18, which device include: an electric power source; the vacuum pump 164 for operating the component placer head 96; and a compressed air source or sources for operating the flux holder drive air cylinder 224, squeezer drive air cylinder 250 and flux container drive air cylinder 6, and for supplying compressed air to the flux container 320.

There will next be described an operation of the present transfer type electronic circuit board fabricating assembly.

The PC boards 24 on which some electronic components have been placed by the upstream circuit board fabricating assembly disposed upstream of the loading module 10 of the present assembly are loaded onto the loading module 10 so that some other electronic components are placed on these PC boards 24 by the present assembly. The PC boards 24 loaded onto the loading module 10 are transferred to the first working module 12 by the conveyor device 26.

Figure 16:
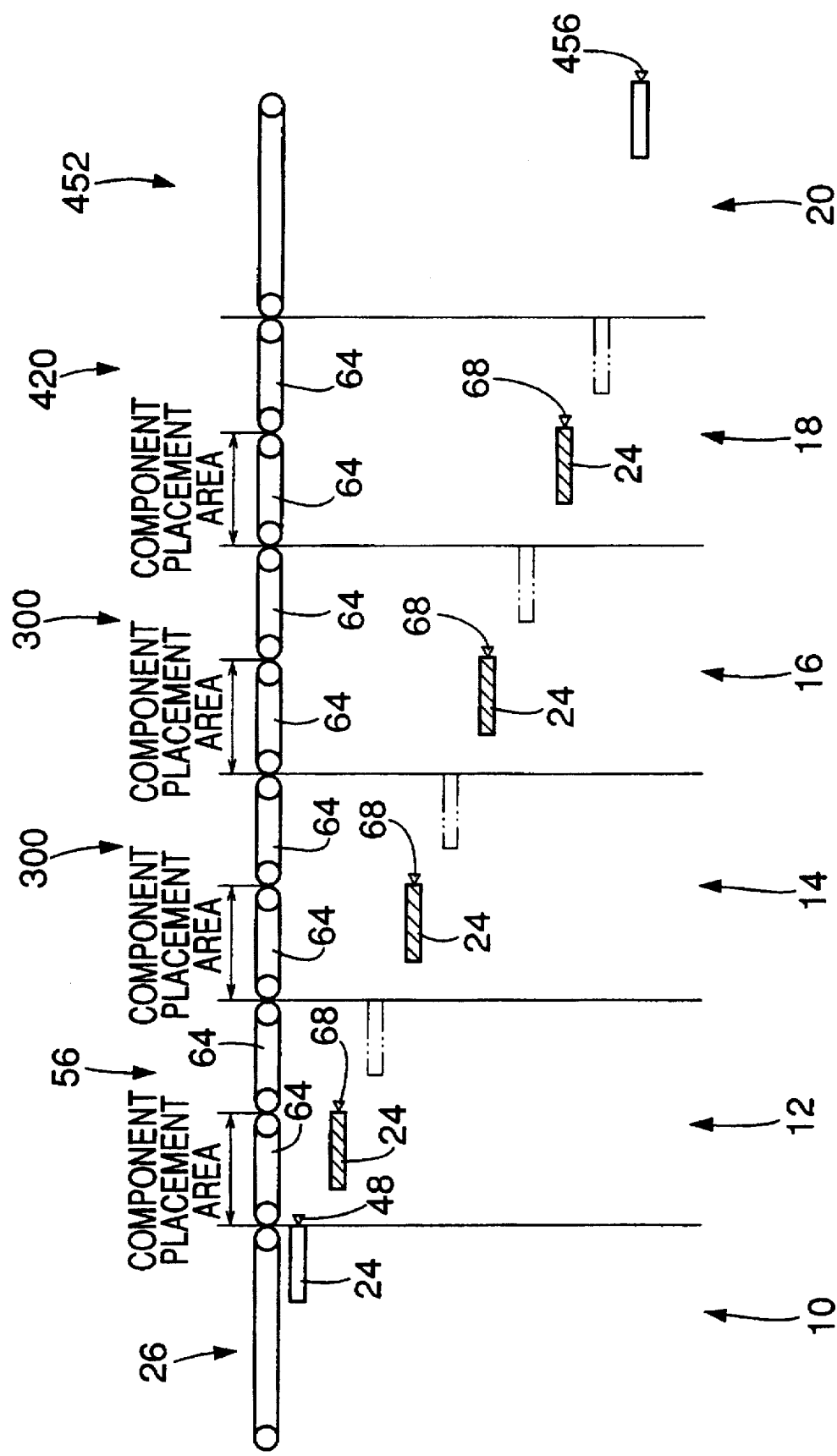
FIG. 16 is a view for explaining a transfer of a small-sized printed circuit board through the system when electronic components are placed on the board.
Figure 17:
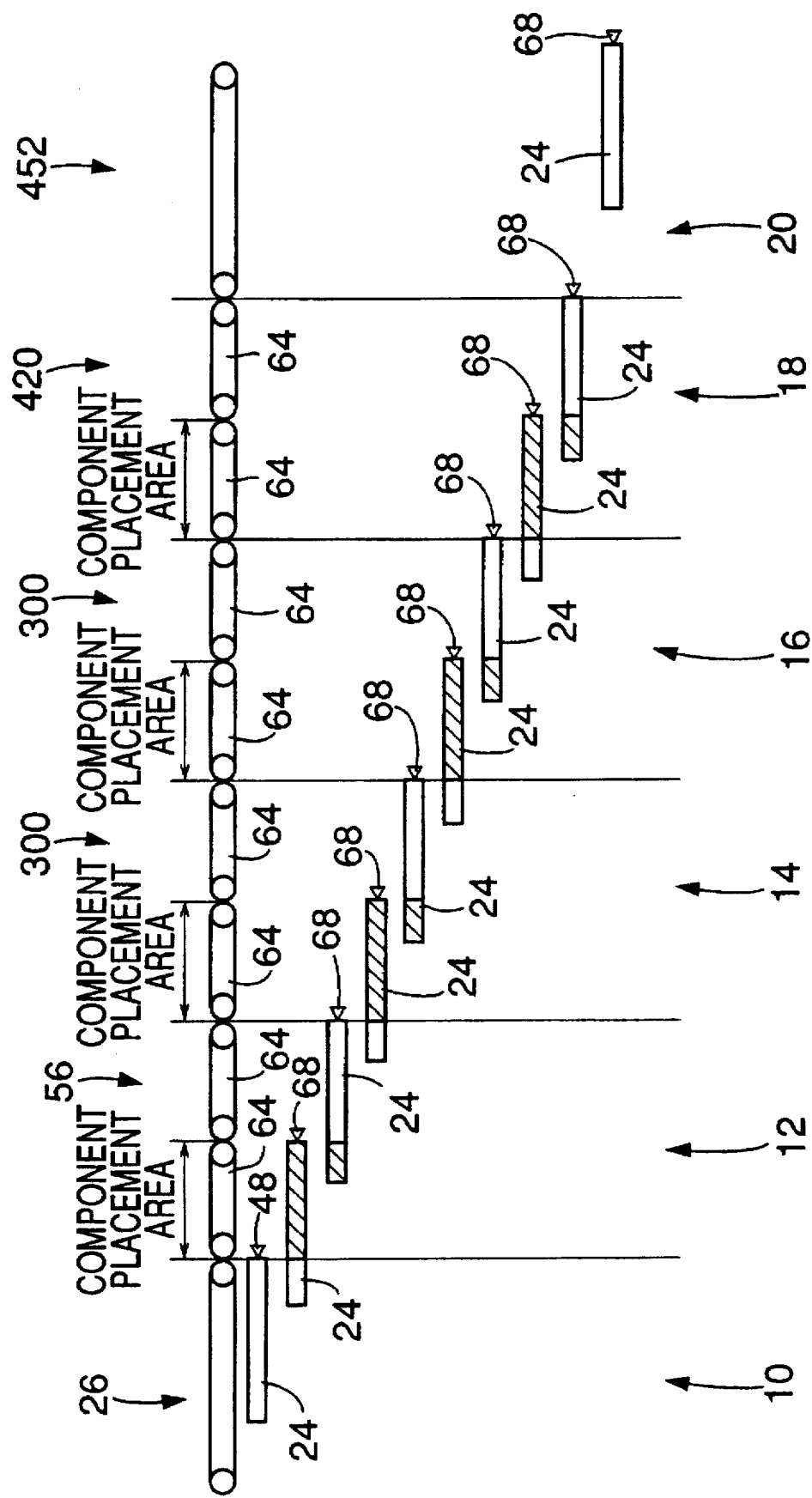
FIG. 17 is a view for explaining a transfer of a large-sized printed circuit board through the system when the electronic components are placed in the board.

In the first working module 12, each PC board 24 is positioned in place by the stopper device 68, on the upstream one of the two belt conveyors 64 of the conveyor device 56, as indicated in FIG. 16. If the dimension of the PC board 24 in the X-axis direction (board transfer direction) is smaller than the X-axis dimension of the predetermined component placement area of the first working module 12, the entire X-axis dimension of the PC board 24 lies within the predetermined component placement area, as shown in FIG. 16. If the X-axis size of the PC board 24 is larger than the X-axis dimension of the component placement area, a downstream portion of the X-axis dimension of the PC board 24 lies within the component placement area, as shown in FIG. 17.

There will first be described an operation of the present circuit board fabricating assembly where the X-axis dimension of the PC board 24 is smaller than the X-axis dimension of the predetermined component placement area of the first working module 12.

While the PC board 24 is positioned by the stopper device 68, the lifter 71 of the upstream board support device 70 is moved up, operated to hold the PC board 24 by vacuum suction, and is further moved up to lift the PC board 24 above the belt conveyor 64. Then, the reference mark imaging device 100 is moved to a position right above a reference mark provided on the PC board 24, and the imaging device 100 is activated to obtain image data of the reference mark. The image data are sent to the controller 62 and then to the coordinating control device 460, so that the control device 460 calculate the positioning errors ΔXp, ΔYp and Δθp of the PC board 24 in the X–Y horizontal plane, on the basis of the image data.

Then, the component placer head 96 is moved toward the component supply device 58, and receives an electronic component from one of the component supply cartridges 190. If this electronic component is a flip chip, for example, the solder bumps need to be coated with a flux. In this case, the placer head 96 holding the electronic component at its suction tube 174 is moved in the X-axis direction so that the electronic component is right above the flux coating device 200, more precisely, right above the flux accommodating recess 216. Then, the placer head 96 is moved down so that the solder bumps of the electronic component are contacted with the bottom surface of the recess 216. Thus, the solder bumps are coated with the flux accommodated in the recess 216.

The placer head 96 is then moved up, and moved in the horizontal plane so that the flip chip held by the suction tube 174 is located right above the component imaging device 272. Image data of the flip chip are obtained by the imaging device 272 and are sent to the coordinating control device 460 through the controller 62. The control device 460 calculate the positioning errors ΔXe, ΔYe and Δθe of the flip chip on the basis of the received image data.

The image data processor 498 of the coordinating control device 460 calculate X-axis and Y-axis position compensating values of the placer head 96 and a θ-axis position compensating value of the flip chip, on the basis of the positioning errors ΔXe, ΔYe, Δθe of the flip chip and the positioning errors ΔXp, ΔYp, Δθp of the PC board 24. These position compensating values are sent to the controller 62, which commands the placer head 96 to a predetermined component placement position as compensated by the X-axis and Y-axis position compensating values, and also commands the placer head 96 to be rotated about the Z-axis by an angle represented by the θ-axis position compensating value. Then, the placer head 96 is moved down to place the flip chip on the PC board 24, at the compensated placement position. The flip chip is provisionally held on the PC board by the flux applied to the solder bumps, until the PC board 24 is transferred into the heating furnace located downstream of the present fabricating assembly.

Ordinary electronic components need not be coated with a flux. When the component to be placed on the PC board 24 in the first working module 12 is an ordinary component, the component received from the appropriate cartridge 190 and held by the placer head 96 is placed on the PC board 24 without being contacted with the flux in the recess 216 in the flux coating device 200, after the image of the component is obtained by the imaging device 272 and the X-axis, Y-axis and θ-axis positions of the components are corrected according to the image data, more specifically, position compensating values as described above. The ordinary electronic components are provisionally held on the PC board 24 by a creamy solder which has been applied by screen printing.

When the operation of the first working module 12 to place the desired electronic components on the PC board 24 is completed, the controller 62 informs the coordinating control device 460 of this fact. When the control device 460 has been informed that an operation of the second working module 14 is also completed, the control device 460 commands the two belt conveyors 64 of the first working module 12 and the upstream one of the two belt conveyors 64 of the second working module 14 to be activated to feed the PC board 24 onto the second working module 14 for placing other electronic components on the PC board 24. The PC board 24 is positioned by the stopper device 68, on the upstream belt conveyor 64 of the second working module, so that the PC board 24 is wholly located within the predetermined component placement area of the second working module 14.

In the second working module 14, too, the positioning errors of the PC board 24 and the electronic component are obtained by the reference mark and component imaging devices 100, 272, for compensating the X-axis, Y-axis and θ-axis positions of the electronic component with respect to the PC board 24, before the component is placed on the PC board 24.

In the second working module 14, one of the pallets 340 in the pallet storage 344 is selected and placed on the pallet support block 350, according to the working schedule information received from the coordinating control device 460, before the placer head 96 receives the electronic component from the thus selected pallet 340.

If a flux should be applied to the component to be placed on the PC board 24 in the second working module, for example, if the component is a flip chip, the component is first placed on the PC board 24 by the placer head 96, and then the flux container 320 of the flux applying device 310 is lowered and moved toward the component, and a flux is delivered from the delivery tube 322, to apply the flux between the component and the surface of the PC board 24. The flux spreads by capillarity over the entire contacting surfaces of the component and the PC board 24, so that the component is provisionally held on the PC board 24.

In the third and fourth working modules 16 and 18, electronic components are placed on the PC board 24 as in the second working module 14, after the X-axis, Y-axis and θ-axis positions of the components are corrected according to the position compensating values as described above, as in the first and second working modules 12, 14. Upon completion of the operation of the fourth working module 18, the PC board 24 is unloaded from the present fabricating assembly, that is, transferred into the downstream heating furnace, by the conveyor device 452 of the unloading module 20.

If the case where the X-axis dimension of the PC board 24 is larger than the X-axis dimension of the predetermined placement area of the placer head 96 but is smaller than the X-axis dimension of the working modules 12, 14, 16, 18, the PC board 24 is positioned by the upstream stopper 68, on the upstream one of the two belt conveyors 64 in each working module, as indicated in FIG. 17. After the appropriate electronic components are placed on a leading portion of the PC board 24 while the PC board 24 stays on the lifter 71 above the upstream belt conveyor 64, the PC board 24 is fed by the downstream belt conveyor 64 until it is stopped by the downstream stopper 24.

Then, the appropriate electronic components are placed in a trailing portion of the PC board 24 while the PC board 24 stays on the lifter 71 above the downstream belt conveyor 64. Thus, the first and second operations to place the components in the leading and trailing portions of the PC board 68 are performed successively and independently of each other on the upstream and downstream lifters 71 above the upstream and downstream belt conveyors 64. To this end, the PC board 24 is fed intermittently by a distance equal to a half of the X-axis dimension of each working module 12, 14, 16, 18, at one time, that is, fed until the PC board 24 is stopped by the stoppers 68 located at the downstream ends of the two belt conveyors 64.

Thus, the components can be placed in the predetermined placement area of the PC board 24, irrespective of whether the X-axis dimension of the predetermined placement area of the PC board 24 is equal to or smaller than the X-axis dimension of the predetermined placement area of the placer head 96. In either case, the downstream end of the placement area of the placer head 96 is used as a reference position for positioning the PC board 24 and the components to be placed on the PC board 24. Thus, the placer head 96 can be easily controlled to correctly place the components at the specified positions on the PC board 24.

Where the X-axis dimension of the PC board 24 is larger than that of the working modules 12, 14, 16, 18, three or more operations to place the components are successively performed, with the PC board 24 intermittently fed three or more times.

The component supply cartridges 190 and/or the component supply pallets 340 should be changed in some cases where the type of the PC board 24 and the kinds of the electronic components to be placed on the PC board 24 (and the number and positions of the components) are changed. When a given lot of component placing operation is completed on the present fabricating assembly, the controller 62 provides the coordinating control device 460 with OPERATION END information which indicates the component placing operation has been completed. This OPERATION END information is part of STATUS information which indicates the status of each working module 12–18. At this time, the control device 460 loads the controllers 62, 306, 430 with a new component placing program which is used to perform a new lot of component placing operation.

It will be understood that the image data processor 498 is used commonly for all the working modules 12, 14, 16, 18. It will also be understood that the flux holder 204 having the recess 216 serves as a holder for holding or accommodating a flux as a component fixing material or agent for provisionally fixing an electronic component on the PC board 24, and that the flux coating device 200 and the flux applying device 310 serve as a device for applying the fixing material to the electronic component. It is noted that the air cylinder 316, ballscrew 312 and stepping motor 317 of the flux applying device 310 constitute a major portion of a device for moving the flux container 320. It is also noted that the compressed air source for supplying compressed air to the flux container 320 and the solenoid-operated control valve 324 for connecting and disconnecting the compressed air source to and from the flux container 320 cooperate to provide a device for forcing the flux into the delivery tube 322.

It will also be understood that the Y-axis slide 80, Y-axis drive motor 86, X-axis slide 94, X-axis drive motor 92, and Z-axis and θ-axis drive motor 98 cooperate to constitute a placer head positioning device for moving the placer head 96 along the X-, Y- and Z-axes. The Z-axis and θ-axis drive motor 98 also serves as a device for rotating the suction tube 174 of the placer head 96.

It will be understood that a portion of the control device 460 assigned to control the conveyor devices 26, 56, 300, 420, 452 constitutes control means for controlling conveyor means for transferring the PC board 24 through the circuit board fabricating assembly.

It will also be understood that the air cylinder 224 functions as a device for moving the flux holder 204 and the squeezers 248 relative to each other in the Y-axis direction. This device cooperates with the squeezers 248 to provide a device for filling the recess 216 with the fixing material or agent for provisionally fixing the electronic component to the PC board 24.

It will be understood that the side frame plates 214 disposed on the base 206 of the flux holder 204 serve as a hollow member which cooperates with the bottom plate 212 or the base 206 to define the recess 216.

In the present embodiment, the transfer type circuit board fabricating assembly is formed along a single straight line. However, the principle of the present invention is equally applicable to a transfer type circuit board fabricating system having two fabricating assemblies which are arranged along respective two straight lines, as illustrated in FIG. 18.

Figure 18:
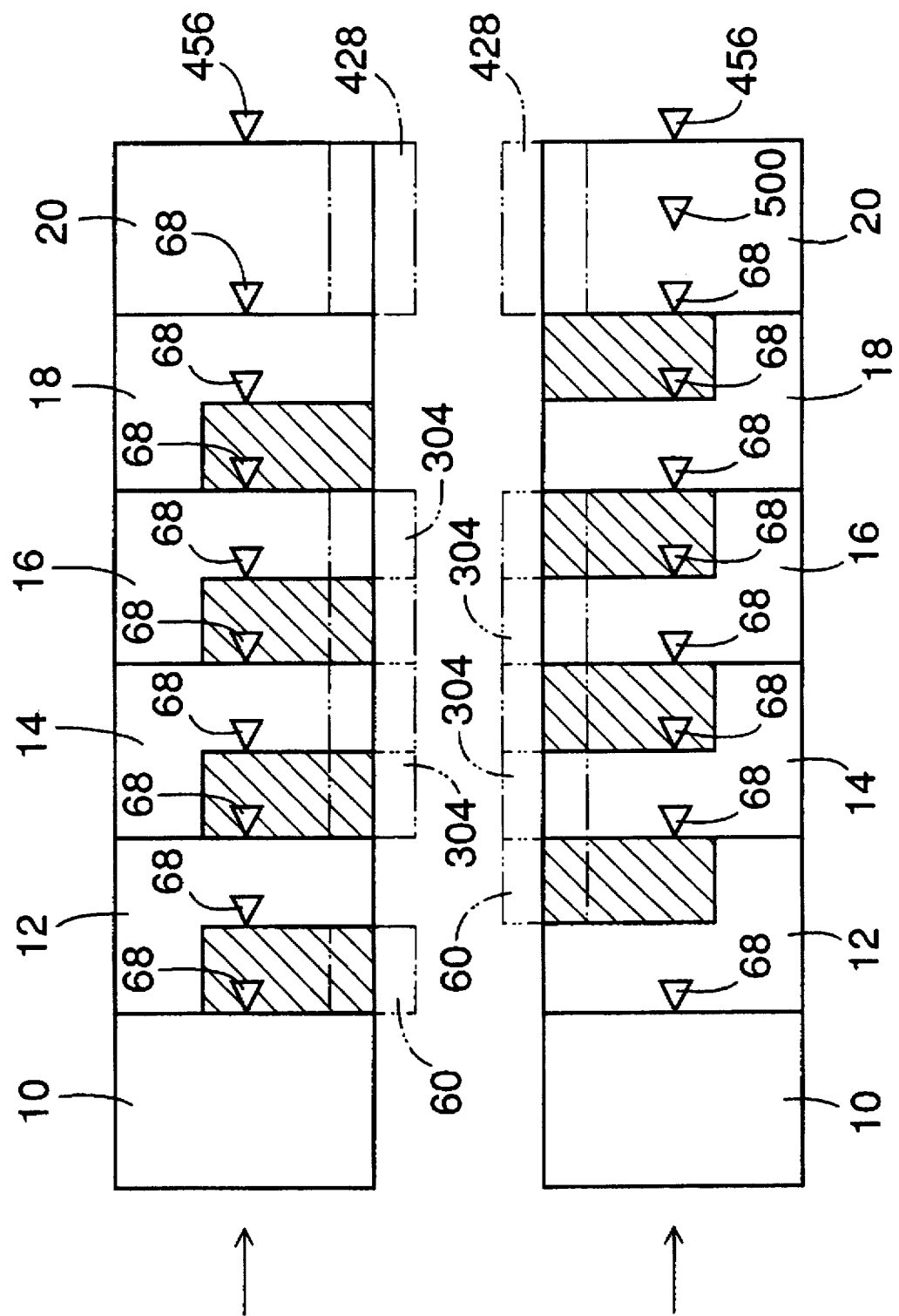
FIG. 18 is a view schematically showing another embodiment of the present invention in the form of a transfer type circuit board fabricating system having two fabricating assemblies.

In the embodiment of FIG. 18, the upper fabricating assembly has the same construction as the fabricating assembly of the first embodiment. The other, lower fabricating assembly is constructed such that the working modules 12, 14, 16, 18 are arranged in the same order as in the upper fabricating assembly, but each of these working modules 12, 14, 16, 18 is rotated through 180° about the Z-axis or vertical axis, so that the predetermined component placement areas of the working modules (indicated by hatching in FIG. 18) of the lower assembly are opposed to the non-placement areas of the corresponding working modules of the upper assembly. The component supply devices 60, 304, 424 in the lower assembly are located on the side facing the upper assembly.

Figure 19:
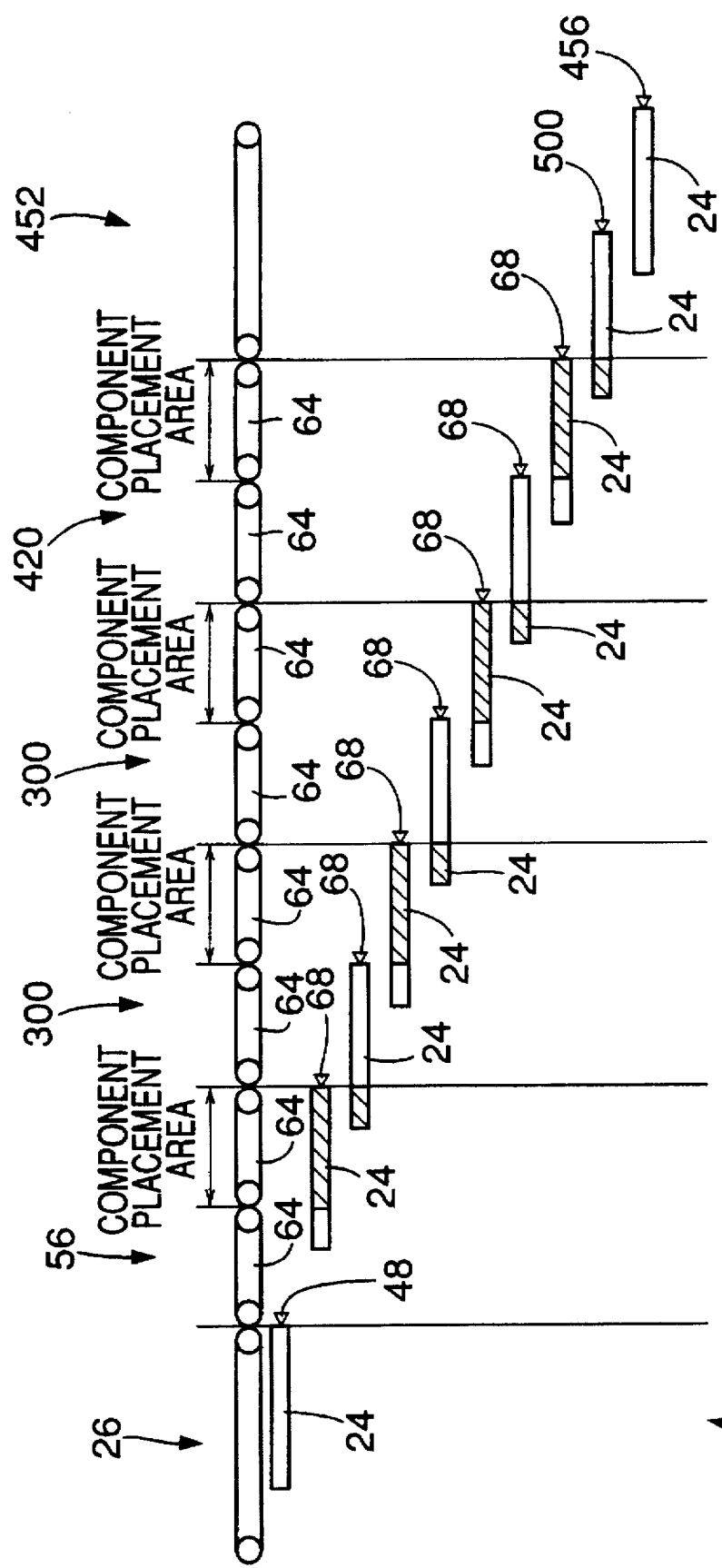
FIG. 19 is a view for explaining a transfer of a printed circuit board for placement of electronic components thereon, in one of the two assemblies of the fabricating system of FIG. 18, in which the working modules are oriented differently from those of the fabricating assembly of FIGS. 1–17.

In both of the upper and lower assemblies, the PC boards 24 are transferred from left to right as indicated by arrows. Suppose the operating direction of the belt conveyors 64 of the conveyor devices 56, 300, 420 for transferring the PC board 24 in the right direction in the upper assembly is in the forward direction of the conveyor drive motors 66, the the conveyor drive motors 66 in the lower assembly should be operated in the reverse direction for transferring the PC board 24 in the same direction (right direction) as in the upper assembly, since each working module 12, 14, 16, 18 in the lower assembly is rotated through 180° with respect to the corresponding working module in the upper assembly. The stopper devices 68 in the lower assembly should be suitably located to stop the PC board 24 in each working module.

Where the X-axis dimension of the PC board 24 is larger than that of the component placement area of the placer heads 96 in one of the two fabricating assemblies, the electronic components are placed on the PC board 24 in the same manner as described above. In the other fabricating assembly, the components are placed on the PC board 24 as illustrated in FIG. 19. In the working modules 12, 14, 16, 18 in this assembly, the component placement areas are provided corresponding to the downstream belt conveyors 64. In each working module, therefore, the PC board 24 is first transferred until it is stopped by the stopper device 68 of the downstream belt conveyor 64, and then predetermined electronic components are placed in a leading portion of the PC board 24. Subsequently, the PC board 24 is transferred until it is stopped by the stopper device 68 of the upstream belt conveyor 64 of the next working module or by a stopper device 500 provided in the unloading module 20, and predetermined electronic components are placed in a trailing portion of the PC board 24.

The stopper device 500 in the unloading module 20 is positioned such that the distance between this stopper device 500 and the stopper device 68 of the downstream belt conveyor 64 in the fourth working module 18 is equal to the transfer distance of the belt conveyors 64. Accordingly, the trailing portion of the PC board 24 lies within the component placement area of the fourth working module 18.

In the present fabricating system, the two fabricating assemblies are disposed in parallel with each other such that each working module in one of the two assemblies is rotated through 180°, so that the operator of the fabricating system may gain easy access to the working modules on the mutually facing sides of the two assemblies while the operator stays in a space between the two assemblies. Thus, the system can be easily attended by the operator. Further, the use of the same working modules, namely, the use of the same placer heads 96 and component supply cartridges 190, for example, in the two assemblies facilitates the maintenance of the fabricating system.

In the illustrated embodiments, the fabricating assembly or assemblies is/are provided with the devices for applying a flux to the electronic components as well as the devices for placing the components on the PC board 24. However, the fabricating assembly or assemblies may be provided with an additional working module or modules adapted to perform other operations, or one or more of the working modules 12, 14, 16, 18 may be replaced with other working module or modules.

While the electronic components are fixed or bonded to the PC board by a solder or a creamy solder, other materials may be used to fix the electronic components. For example, the components may be fixed to the PC board by an electrically conductive film, an electrically conductive adhesive or bonding agent, or an anisotropic electrically conductive film. Where the anisotropic electrically conductive film is used, an electronic component is forced against the PC board through the film, so that metal particles included in a resin layer of the film are connected to each other to establish electrical continuity between the electronic component and an electronic circuit on the PC board. In this case where such anisotropic electrically conductive film is used to fix the electronic component to the PC board, the working modules include a working module or modules adapted to apply such film to the entire surface of the PC board or to selected local portions of the PC board (in which the electronic components are placed), and to force the electronic component against the PC board.

For fixing the electronic component to the PC board, it is possible to use a bonding agent or adhesive which shrinks upon curing or setting thereof. In this case, either the electronic component in the form of a semiconductor chip or local portions of the PC board around solder bumps is/are coated with such a bonding agent or adhesive, and the electronic component is forced against the PC board. The shrinkage of the bonding agent permits close contact of the solder bumps and the circuit on the PC board. The use of such shrinkable bonding agent assures improved durability of the PC board, particularly where the PC board is formed of an epoxy resin which contains glass fibers. In this case, the working modules include a module or modules adapted to apply such shrinkable bonding agent and force the electronic component against the PC board.

While the flux coating device 200 is adapted to apply a flux to the electronic component, the flux may be applied to selected local portions of the PC board in which the electronic components are placed. In this instance, the working modules include a module or modules adapted to apply the flux to the PC board.

The transfer type circuit board fabricating assembly according to the present invention may include a working module or modules adapted to perform operations other than the operations to place the electronic components on the PC board. For instance, the fabricating assembly may include a working module at an upstream portion thereof, which module has a screen printing unit for effecting screen printing to form a pattern of a creamy solder on the PC board, so that the electronic components placed in the downstream working modules are fixed by the screen-printed solder pattern.

In the illustrated embodiments, the fabricating assembly or system is arranged along a straight line or parallel straight lines. However, the fabricating assembly or assemblies may be arranged along a bent line or lines. In this case, the fabricating system requires a working module or modules for changing the direction of transfer of the PC board, in addition to the loading and unloading modules. This arrangement makes it possible to install the fabricating system even where the installation space available does not permit the system to be installed along a straight line.

In the illustrated embodiments, the recess 216 provided in the flux coating device 200 is defined by the bottom plate 212 and the pair of side frame plates 214 secured to the base 206 of the flux holder 204. However, the bottom plate 212 may be an integral part of the base 206. In this case, the depth of the recess 216 may be changed by changing the thickness or height dimension of the side frame plates 214, rather than changing the thickness or height dimension of the bottom plate 212.

In the flux coating device 200, the bottom plate 212 which defines the bottom of the recess 216 also serves as a positioning member for the side frame plates 214. However, the provision of the bottom plate secured to the base 206 or formed integrally with the base 206 is not essential. Namely, the top surface of the base 206 may function to define the bottom of the recess 216.

In the illustrated embodiments, the electronic component held by the placer head 96 is always brought into contact with the bottom surface of the recess 216, to coat the electronic component with the flux (fixing material). That is, the placer head 96 is moved in the Z-axis direction to move the electronic component until it is contacted with the bottom surface of the recess 216. However, the distance of movement of the electronic component (placer head 96) toward the bottom surface of the recess 216 in the Z-axis direction may be suitably controlled to adjust the amount of the flux to be applied to the electronic component.

In the component supply device 304 which includes the component supply pallets 340 in which the electronic components are accommodated, the pallet storage 344 having the racks 342 for supporting the pallets 340 is fixedly provided on the bed 298. However, the pallet storage 344 may be adapted to be vertically movable by a suitable device, like the pallet support block 350. In this case, the pallets 340 may be replaced or interchanged by moving the pallet storage 344 to a position at which the pallet storage 344 does not interfere with the air cylinders 362 for the pallet support block 350.

In the component supply device 60 provided in the illustrated embodiments, a component carrier tape wherein electronic components are accommodated in respective recesses is fed by a feed device from the reel of the component supply cartridge 190. However, the component carrier tape may be replaced by a casing which accommodates a succession of electronic components and which is oscillated by a suitable oscillator so as to feed the electronic components one after another.

The conveyor devices 26, 56, 300, 420, 452 may use conveying mechanisms other than belt conveyors. For instance, the conveyor devices may use a mechanism wherein a board transfer bar which has jaws engageable with the PC board is moved at a predetermined pitch in its longitudinal direction by a suitable feed device.

The stopper devices 48, 68, 456, 500 which are adapted to mechanically stop the PC board by abutting contact with the PC board may be replaced by electrically operated stopper devices. For example, the amount of operation of the conveyor drive motor is detected by a suitable detector, and the distance of movement of the PC board is calculated from the detected operation amount of the motor, so that the motor is turned off to stop the movement of the PC board when the calculated movement distance reaches a predetermined distance. Alternatively, a detector is provided to detect the PC board when the PC board has reached a predetermined position, so that the conveyor drive motor is turned off when the PC board is detected.

While the board support devices 70 are adapted to hold the PC board 24 by vacuum suction, the devices 70 may be modified such that the PC board placed on the lifter 71 is forced against a suitable member which is provided above the conveyor device and which is engageable with the PC board when the PC board is lifted by the lifter 71.

Although the working modules 12, 14, 16, 18 have the same X-axis dimension, these working modules have different X-axis dimensions.

In the illustrated embodiments, the flux coating device 200 is provided in the first working module 12 wherein the electronic components are supplied by the cartridges 190. Since the flux coating device 200 has a generally elongate configuration similar to that of the cartridges 190, the device 200 is removably mounted on the support block 196 together with the cartridges 190. However, the flux coating device 200 may be mounted otherwise at a different location by means of a different mounting device.

Figure 20:
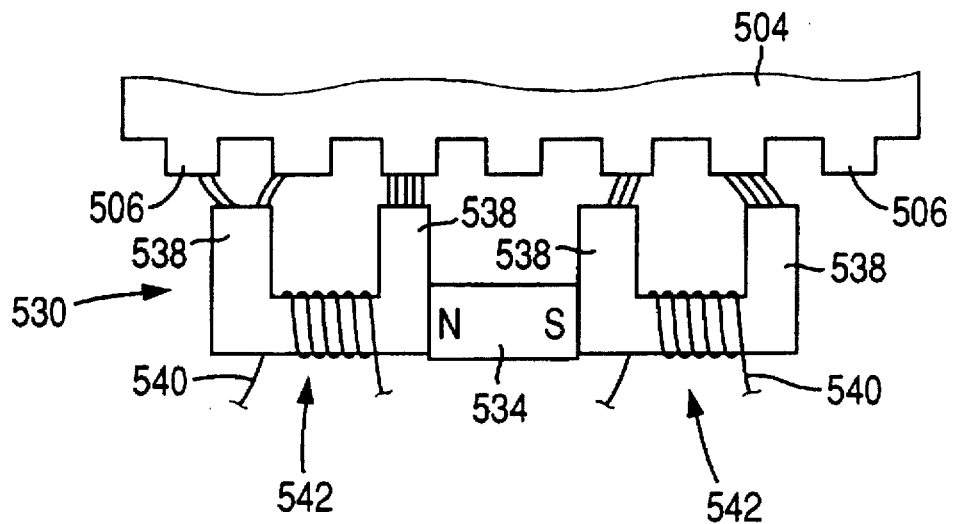
FIG. 20 is a view illustrating a plane type stepping motor used in a further embodiment of the invention, for moving a component placer head in X-axis and Y-axis directions.
Figure 21:
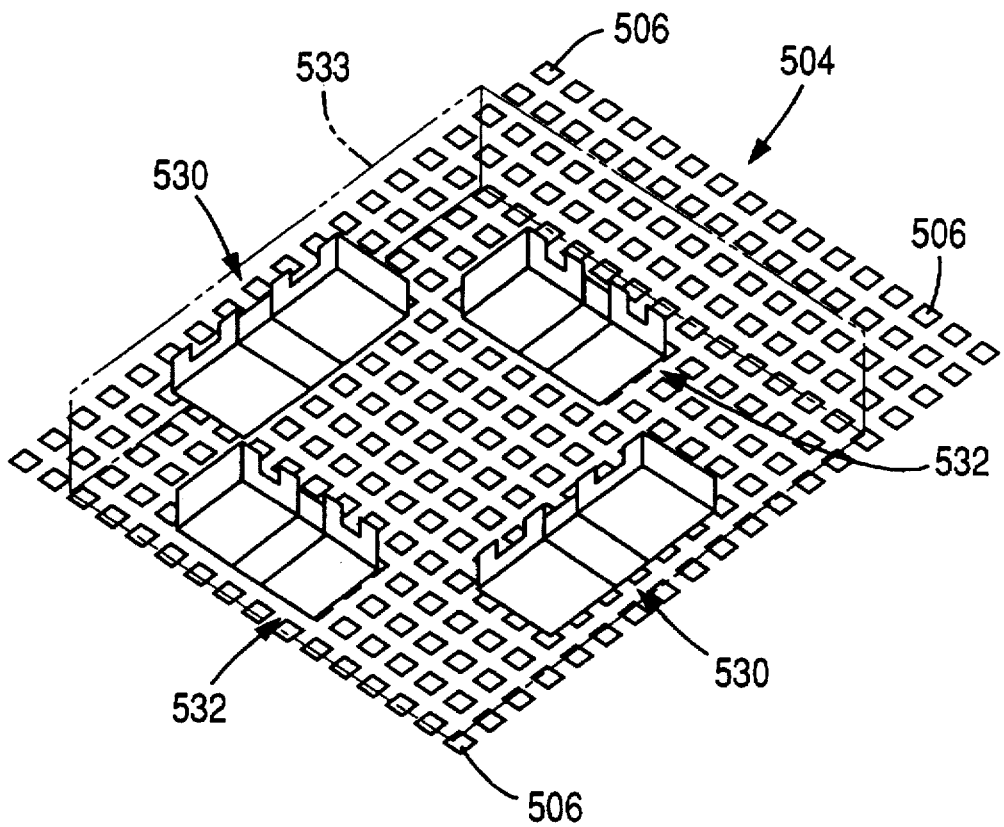
FIG. 21 is a perspective view illustrating X-axis and Y-axis movable members of the plane type stepping motor of FIG. 20.

While the component placer head 96 in each working module is moved in the horizontal X–Y plane by the X-axis and Y-axis drive motors 92, 86 in the illustrated embodiments, a plane type stepping motor as shown in FIGS. 20 and 21 may be used for positioning the placer head 96 in the X–Y plane. In this case, the placer head 96 is supported or carried by a head holder 533 (FIG. 21) which is provided with two pairs of X-axis movable members 530 and two pairs of Y-axis movable members 532. The movable members 530, 532 are opposed to a stationary stator 504 fixed on a suitable support member such as the beam 74 (FIGS. 1 and 5). The stator 504 is formed of a magnetic material and has a rectangular matrix of pole teeth 506 formed on a surface thereof facing the head holder 533.

As shown in FIG. 21, the two X-axis movable members 530 are spaced from each other in the Y-axis direction while the two Y-axis movable members 532 are spaced apart from each other in the X-axis direction. As shown in FIG. 20 by way of example, each of the two X-axis movable members 530 consists of a central permanent magnet 534 and two electromagnets 542 which are connected to N and S pole faces of the permanent magnet 534. Each electromagnet 542 has two pole teeth 538 and a coil 540 wound on a portion thereof between the two pole teeth 538. The two electromagnets 542 are spaced from each other in the X-axis direction. Each of the two Y-axis movable members 532 has the same construction as the X-axis movable members 530. The two electromagnets 542 of each Y-axis movable member 530 are spaced from each other in the Y-axis direction.

The head holder 533 is moved in the X-axis and Y-axis directions by suitably controlling the electric current to be applied to the coils 540 of the electromagnets 542 of the X-axis and Y-axis movable members 530, 532, whereby the placer head 96 supported by the head holder 533 is positioned in the X-Y plane as needed.

While the coordinating control device 460 is disposed in the loading module 10, the control device 460 may be disposed in the unloading module 20, depending upon the configuration of the fabricating system.

It will be understood that the illustrated embodiments may be modified otherwise, with various alterations in the combination of the constituent elements.

It is to be understood that the present invention may be embodied with various other changes, modifications and improvements, which may occur to those skilled in the art, without departing from the spirit and scope of the invention defined in the following claims.

What is claimed is:

1. A transfer type circuit board fabricating system comprising:
   a plurality of working modules each of which includes (a) a conveyor device for transferring circuit boards in a predetermined transfer direction, (b) a working device for performing a predetermined operation on said circuit boards, and (c) a controller comprising a computer as a major portion thereof, for controlling said working device, said working modules being arranged so that the conveyor devices transfer the circuit boards one after another in said predetermined transfer direction through the working devices of the working modules such that each of said circuit boards is directly transferable from one of the adjacent working modules to the other of said adjacent working modules; and
   a coordinating control device comprising a computer as a major portion thereof, for controlling the operations of said conveyor devices of said plurality of working modules, on the basis of predetermined working schedule information which is stored therein and which relates to said predetermined operation to be performed by said working device of said each working module, and status information which is received from said controllers of said working modules and which indicates operating states of said working modules.

2. A transfer type circuit board fabricating system according to claim 1, wherein said working device of said each working module comprises a component placing device for placing electronic components on said circuit boards, said component placing device having a predetermined component placement area in which said electronic components can be placed on said circuit boards and whose dimension in said predetermined transfer direction is smaller than a dimension of said each working module, said conveyor device intermittently transferring said circuit boards by a predetermined distance at one time, which distance is not larger than said dimension of said component placement area in said transfer direction.

3. A transfer type circuit board fabricating system according to claim 1, further comprising a loading module located upstream of a succession of said plurality of working modules as viewed in said predetermined transfer direction, said loading module including a conveyor device for introducing said circuit boards into one of said working modules located at an upstream end of said succession, said coordinating control device being provided in said loading module.

4. A transfer type circuit board fabricating system according to claim 1, further comprising an unloading module located downstream of a succession of said plurality of working modules as viewed in said predetermined transfer direction, said unloading module including a conveyor device for removing said circuit boards from one of said working modules at a downstream end of said succession, said coordinating control device being provided in said unloading module.

5. A transfer type circuit board fabricating system according to claim 1, wherein at least one of said working devices of said plurality of working modules includes a component placing device for placing said electronic components on said circuit boards, a component supply device for supplying said component placing device with said electronic components, and a coating device for coating said electronic components with a fixing material for provisionally fixing said electronic components on said circuit boards before said electronic components supplied from said component supply device are placed on said circuit boards, said coating device including a material holder for holding said fixing material in the form of a layer.

6. A transfer type circuit board fabricating system according to claim 5, wherein said coating device includes a squeezer, and a moving device for moving said squeezer and said material holder relative to each other, said material holder having a sliding surface on which said squeezer slidably moves, and a recess which has a predetermined depth from said sliding surface and which accommodates the layer of said fixing material, said moving device moving said squeezer in sliding contact with said sliding surface to thereby fill said recess with said layer of said fixing material.

7. A transfer type circuit board fabricating system according to claim 6, wherein said coating device brings each of said electronic components into contact with a bottom surface of said recess through said layer of said fixing material, to thereby coat said each electronic component with said fixing material.

8. A transfer type circuit board fabricating system according to claim 6, wherein said material holder includes a base, and a hollow member which is removably fixed on said base and which cooperates with said base to define said recess.

9. A transfer type circuit board fabricating system according to claim 5, wherein said coating device includes means for moving each of said electronic components held by said component placing device, into contact with said layer of said fixing material, to thereby coat said each electronic component with said fixing material, and means for controlling a distance of movement of said each electronic component relative to said layer of said fixing material in contact with said layer.

10. A transfer type circuit board fabricating system according to claim 5, wherein said coating device is disposed adjacent to said component supply device in said predetermined transfer direction of said circuit boards.

11. A transfer type circuit board fabricating system according to claim 1, wherein at least one of said working devices of said plurality of working modules includes a component placing device for placing said electronic components on said circuit boards, a component supply device for suppling said component placing device with said electronic components, and an applying device for applying by capillarity a fixing material between said circuit boards and said electronic components placed on said circuit boards, for provisionally fixing said electronic components on said circuit boards.

12. A transfer type circuit board fabricating system according to claim 11, wherein said applying device includes a material container for accommodating said fixing material, a delivery tube communicating with said material container, and a device for forcing said fixing material in said material container to thereby deliver said fixing material through said delivery tube.

13. A transfer type circuit board fabricating system according to claim 1, wherein at least one of said working devices of said plurality of working modules includes a component supply device, and a component placing device for receiving said electronic components from said component supply device and placing the electronic components on said circuit boards, said component supply device including (i) a plurality of component supply pallets each accommodating a plurality of electronic components, (ii) a pallet storage having a plurality of pallet racks which are spaced from each other in a vertical direction and which support said plurality of component supply pallets, respectively, (iii) a pallet support block disposed adjacent to said pallet storage, (iv) a first moving device for moving at least one of said pallet storage and said pallet support block relative to each other in the vertical direction so that said pallet support block has the same position in the vertical direction as a selected one of said pallet racks, and (v) a second moving device for moving one of said component supply pallets which corresponds to said selected one of said pallet racks, in a horizontal direction between said selected one of said pallet racks and said pallet support block, said component placing device receiving said electronic components from the component supply pallet placed on said pallet support block.

14. A transfer type circuit board fabricating system according to claim 13, wherein said first moving device of said component supply device moves said pallet support block together with said selected one component supply pallet in said vertical direction to a component transfer position at which said component placing device receives said electronic components from said selected one component supply pallet placed on said pallet support block, said pallet support block being movable by said first moving device between said component transfer position and a lower position not higher than a lowermost one of said pallet racks of said pallet storage.

15. A transfer type circuit board fabricating system according to claim 13, wherein said pallet storage and said pallet support blocks are disposed adjacent to each other in said predetermined transfer direction of said circuit boards.

16. A transfer type circuit board fabricating system according to claim 1, further comprising at least one common device which is disposed together with said coordinating control device and which is used commonly for all of said plurality of working modules.

17. A transfer type circuit board fabricating system according to claim 1, wherein said conveyor device of each of said plurality of working modules includes a plurality of conveyors which are disposed in series in said predetermined transfer direction of said circuit boards.

18. A transfer type circuit board fabricating system according to claim 1, wherein said conveyor device of each of said plurality of working modules is capable of transferring said circuit boards in opposite directions in said predetermined transfer direction.

19. A transfer type circuit board fabricating system comprising:

a plurality of working modules each of which includes (a) a conveyor device for transferring circuit boards in a predetermined transfer direction, (b) a working device for performing a predetermined operation on said circuit boards, and (c) a controller comprising a computer as a major portion thereof, for controlling said working device, said working modules being arranged such that the conveyor devices transfer the circuit boards one after another in said predetermined transfer the circuit boards one after another in said predetermined transfer direction through the working devices of the working modules;

said working device of said each working module having a predetermined working area in which said predetermined operation can be performed by said working module and whose dimension in said predetermined transfer direction is smaller than a dimension of said each working module;

a coordinating control device comprising a computer as a major portion thereof, for controlling the controllers of said plurality of working modules, on the basis of predetermined working schedule information which is stored therein and which relates to said predetermined operation, and status information which is received from said controllers of said working modules and which indicates operating states of said working modules; and said coordinating control device controlling the conveyor device of said each working module such that said circuit boards are intermittently transferred by said conveyor device by a predetermined distance at one time, which distance is not larger than said dimension of said working area in said transfer direction.

20. A transfer type circuit board fabricating system according to claim 19, wherein said working device of said each working module comprises a component placing device for placing electronic components on said circuit boards, and said predetermined working area is a component placement area in which said electronic components can be placed on said circuit boards by said component place device.

21. A transfer type circuit board fabricating system comprising:

a plurality of working modules each of which includes (a) a conveyor device for transferring circuit boards in a predetermined transfer direction, (b) a working device for performing a predetermined operation on said circuit boards, and (c) a controller comprising a computer as a major portion thereof, for controlling said working device, said working modules being arranged such that the conveyor devices transfer the circuit boards one after another in said predetermined transfer direction through the working devices of the working modules;

said plurality of working modules including a plurality of mutually similar working modules which comprise respective common working devices that perform common operations substantially identical with each other, said common working devices being controlled by the controllers of said mutually similar working modules;

a coordinating control device comprising a computer as a major portion thereof, said computer including a data processor for processing sets of data which are received from said controllers of said mutually similar working modules and which are obtained as a result of said common operations performed by said common working devices, said data processor generating control data as a result of processing of said sets of data, said coordinating control device commanding said controllers of said mutually similar working modules to control said mutually similar working modules according to said control data generated by said data processor.

22. A transfer type circuit board fabricating system according to claim 1, wherein said common working device of each of said mutually similar working modules comprises a reference mark imaging device for obtaining image data of a reference mark provided on each of said circuit boards, and wherein said data processor including an image data processing portion for processing said image data.

23. A transfer type circuit board fabricating system according to claim 1, wherein said working device of each of said plurality of working modules comprises a component placing device for placing electronic components on said circuit boards, and said common working device of each of said mutually similar working modules comprises a component imaging device for obtaining image data representative of an attitude of each of said electronic components when said each electronic component is held by said component placing device, and wherein said data processor includes an image data processing portion for processing said data.

24. A transfer type circuit board fabricating system comprising:

a plurality of working modules each of which includes (a) a conveyor device for transferring circuit boards in a predetermined transfer direction, (b) a working device for performing a predetermined operation on said circuit boards, and (c) a controller comprising a computer as a major portion thereof, for controlling said working device, said working modules being arranged such that the conveyor devices transfer the circuit boards one after another in said predetermined transfer direction through the working devices of the working modules;

a coordinating control device comprising a computer as a major portion thereof, for controlling the controllers of said plurality of working modules, on the basis of predetermined working schedule information which is stored therein and which relates to said predetermined operation to be performed by said working device of said each working module, and status information which is received from said controllers of said working modules and which indicates operating states of said working modules;

a loading module located upstream of a succession of said plurality of working modules as viewed in said predetermined transfer direction, said loading module including a conveyor device for introducing said circuit boards into one of said working modules located at an upstream end of said succession; and;

an unloading module located downstream of said succession of said plurality of working modules as viewed in said transfer direction, said unloading module including a conveyor device for removing said circuit boards from one of said working modules at a downstream end of said succession;

and wherein said coordinating control device is located at at least one of said loading module and said unloading module.

* * * * *